(12) United States Patent
Kanamaki

(10) Patent No.: US 11,280,830 B2
(45) Date of Patent: Mar. 22, 2022

(54) APPARATUS, METHOD, AND STORAGE MEDIUM

(71) Applicant: ADVANTEST CORPORATION, Tokyo (JP)

(72) Inventor: Shunichi Kanamaki, Gunma (JP)

(73) Assignee: ADVANTEST CORPORATION, Tokyo (JP)

( * ) Notice: Subject to any disclaimer, the term of this patent is extended or adjusted under 35 U.S.C. 154(b) by 268 days.

(21) Appl. No.: 16/533,736

(22) Filed: Aug. 6, 2019

(65) Prior Publication Data

US 2020/0088789 A1 Mar. 19, 2020

(30) Foreign Application Priority Data

Sep. 13, 2018 (JP) .............................. JP2018-171557

(51) Int. Cl.
*G01R 31/317* (2006.01)

(52) U.S. Cl.
CPC ... *G01R 31/3172* (2013.01); *G01R 31/31703* (2013.01); *G01R 31/31718* (2013.01); *G01R 31/31721* (2013.01)

(58) Field of Classification Search
None
See application file for complete search history.

(56) References Cited

U.S. PATENT DOCUMENTS

| 6,535,986 B1 | 3/2003 | Rosno | |
| 2007/0203659 A1* | 8/2007 | Yamaguchi | G01R 31/31709 702/69 |
| 2010/0142391 A1* | 6/2010 | Ishikawa | H04L 41/145 370/252 |
| 2011/0137606 A1* | 6/2011 | Ishikawa | H04L 43/50 702/123 |
| 2011/0228309 A1* | 9/2011 | Kikumoto | G06F 3/1238 358/1.14 |
| 2011/0288810 A1* | 11/2011 | Ishikawa | G01R 31/31935 702/123 |
| 2012/0036404 A1* | 2/2012 | Tabata | G11C 29/808 714/722 |
| 2013/0086423 A1* | 4/2013 | Kawakami | G11C 29/56004 714/32 |

FOREIGN PATENT DOCUMENTS

| JP | 2002286789 A | 10/2002 |
| JP | 2005090959 A | 4/2005 |
| JP | 2006030169 A | 2/2006 |
| JP | 2006031354 A | 2/2006 |

* cited by examiner

*Primary Examiner* — Jermele M Hollington

(57) ABSTRACT

Provided is an apparatus including a generating section that generates an altered test candidate obtained by adding an alteration shortening an execution time of a test to a target test for testing a device under test; a test processing section that causes a test apparatus to perform the altered test candidate on the device under test; and a comparing section that compares an altered test result of the device under test resulting from the altered test candidate to a target test result of the device under test resulting from the target test; and a judging section that judges whether the target test can be replaced by the altered test candidate, based on the comparison result of the comparing section.

25 Claims, 15 Drawing Sheets

APPARATUS, METHOD, AND STORAGE MEDIUM

The contents of the following Japanese patent application are incorporated herein by reference:
NO. 2018-171557 filed on Sep. 13, 2018

BACKGROUND

1. Technical Field

The present invention relates to an apparatus, a method, and a storage medium.

2. Related Art

A conventional system is known that shortens test time by removing unnecessary operations or commands from a test program of a device under test (DUT) using a static analysis, as shown in Patent Document 1, for example.
Patent Document 1: Japanese Patent Application Publication No. 2005-090959
In this system, since the operation is unknown, only items that can be logically confirmed can be improved.

SUMMARY

According to a first aspect of the present invention, provided is an apparatus. The apparatus may comprise a generating section that generates an altered test candidate obtained by adding an alteration shortening an execution time of a test to a target test for testing a device under test. The apparatus may comprise a test processing section that causes a test apparatus to perform the altered test candidate on the device under test. The apparatus may comprise a comparing section that compares an altered test result of the device under test resulting from the altered test candidate to a target test result of the device under test resulting from the target test. The apparatus may comprise a judging section that judges whether the target test can be replaced by the altered test candidate, based on the comparison result of the comparing section.

If a difference between the altered test result and the target test result satisfies a passing standard, the judging section may judge that the target test can be replaced by the altered test candidate.

The generating section may generate a new altered test candidate, obtained by adding an alteration that further shortens an execution time of the altered test candidate to the altered test candidate, in response to the difference being judged to satisfy the passing standard.

The generating section may generate a new altered test candidate, obtained by adding an alteration that further shortens an execution time of the altered test candidate to the altered test candidate, in response to a first bin that indicates a classification of the altered test result being judged to be the same as a second bin that indicates a classification of the target test result.

The apparatus may further comprise a determining section that determines an altered test candidate having the shortest execution time, from among a plurality of altered test candidates judged to be capable of replacing the target test, from among a plurality of the altered test candidates, to be an altered test for replacing the target test.

The apparatus may further comprising a determining section that, on a condition that the execution time of an altered test candidate judged to be capable of replacing the target test among a plurality of the altered test candidates is less than or equal to a predetermined objective time, determines the altered test candidate that satisfies the condition to be an altered test for replacing the target test.

The generating section may shorten the execution time by shortening a wait time between a plurality of processes that cause output to the device under test in the target test.

The generating section may generate a plurality of altered test candidates to which are added alterations shortening the wait time between the plurality of processes causing output to the device under test, and the apparatus may further comprise a determining section that searches for a specific altered test candidate that has the shortest execution time, among the plurality of altered test candidates judged to be capable of replacing the target test among the plurality of altered test candidates, and determine the specific altered test candidate to be an altered test for replacing the target test.

The generating section may generate a plurality of altered test candidates to which are added alterations shortening the wait time between the plurality of processes causing output to the device under test, and the apparatus may further comprise a determining section that searches for a specific altered test candidate whose execution time is less than or equal to a predetermined objective time, from among the plurality of altered test candidates judged to be capable of replacing the target test, from among the plurality of altered test candidates, and determine the specific altered test candidate to be an altered test for replacing the target test.

The generating section may generate a plurality of altered test candidates to which are added alterations shortening the wait time between the plurality of processes causing output to the device under test in the target test, and the determining section may search for a specific altered test candidate that has the shortest execution time, from among the plurality of altered test candidates judged to be capable of replacing the target test, from among the plurality of altered test candidates, and determine the specific altered test candidate to be the altered test for replacing the target test.

The generating section may generate a plurality of altered test candidates to which are added alterations shortening the wait time between the plurality of processes causing output to the device under test in the target test, and the determining section may search for a specific altered test candidate whose execution time is less than or equal to a predetermined objective time, from among the plurality of altered test candidates judged to be capable of replacing the target test, from among the plurality of altered test candidates, and determine the specific altered test candidate to be the altered test for replacing the target test.

The determining section may search for the specific altered test candidate by implementing a sequential search that, on a condition that it is judged that the target test can be replaced by the altered test candidate, causes the generating section to repeatedly generate a new altered test candidate to which is added an alteration shortening the wait time of the altered test candidate by a unit of time.

The determining section may search for the specific altered test candidate by implementing a binary search that, on a condition that it is judged that the target test can be replaced by the altered test candidate, causes the generating section to repeatedly generate a new altered test candidate to which is added an alteration shortening the wait time of the altered test candidate, using a bisection method.

The determining section may perform a search for the specific altered test candidate by implementing a screening search that includes, on a condition that it is judged that the target test can be replaced by the altered test candidate based on a comparison result obtained by comparing the target test result to the altered test result obtained by performing, a first number of times, the altered test candidate to which has been added an alteration shortening the wait time by a unit of time, causing the generating section to repeatedly generate a new altered test candidate to which has been added an alteration further shortening the wait time of the altered test candidate by a unit of time and, in response to a judgment being made that the target test cannot be replaced by the altered test candidate, repeating a comparison between the target test result and the altered test result obtained by repeating the altered test candidate immediately before the alteration a predetermined number of times until it is judged that the target test can be replaced by the altered test candidate, and the first number of times may be less than the predetermined number of times.

The apparatus may further comprise a determining section that determines the altered test candidate including a plurality of test sequences, included in the target test, in each of which wait times between a plurality of processes that cause output to the device under test have been altered, using a genetic algorithm in which a set of the wait times between the plurality of processes is a gene, causes the generating section to generate the determined altered test candidate, determines a new altered test candidate that includes the plurality of test sequences in which the wait times between the plurality of processes of the altered test candidate have been further altered using the genetic algorithm, causes the generating section to generate the new altered test candidate, and determines a specific altered test candidate having the shortest execution time among a plurality of altered test candidates judged to be capable of replacing the target test to be an altered test for replacing the target test.

The apparatus may further comprise a determining section that determines the altered test candidate including a plurality of test sequences, included in the target test, in each of which wait times between a plurality of processes that cause output to the device under test have been altered, using a genetic algorithm in which a set of the wait times between the plurality of processes is a gene, causes the generating section to generate the determined altered test candidate, determines a new altered test candidate that includes the plurality of test sequences in which the wait times between the plurality of processes of the altered test candidate have been further altered using the genetic algorithm, causes the generating section to generate the new altered test candidate, searches for a specific altered test candidate whose execution time is less than or equal to a predetermined objective time, among a plurality of altered test candidates judged to be capable of replacing the target test, and determines the specific altered test candidate to be an altered test for replacing the target test.

The generating section may shorten the execution time by deactivating an automatic power OFF process, set in advance in each of a plurality of test sequences included in the target test of the device under test, that automatically turns OFF a power source of the device under test every time one test sequence ends.

The generating section may shorten the execution time by setting a plurality of processes for closing relays that supply power to the device under test to be performed in parallel in the target test.

The generating section may shorten the execution time by setting a process for turning ON a power source of the device under test and a process for turning OFF the power source of the device under test to be performed repeatedly, in a state where relays for supplying power to the device under test are closed, in the target test.

The generating section may shorten the execution time by setting a process in the target test to be performed in parallel with the process for closing the relays.

The generating section may shorten the execution time by eliminating a wait time between a plurality of processes that do not cause output to the device under test in the target test.

The generating section may shorten the execution time by reducing the number of times that a repeating process included in the target test is repeated.

The comparing section may compare an altered statistical value of measured values acquired by repeatedly performing the altered test candidate on the device under test and a target statistical value of measured values acquired by repeatedly performing the target test on the device under test.

The judging section may use a process capability index that is an indicator of a distribution of a plurality of measured values in a statistical value, to judge that the target test can be replaced by the altered test candidate if a standard satisfied by the process capability index of the target statistical value is satisfied by the process capability index of the altered statistical value.

The apparatus may further comprise a display section that displays to a user a screen for showing the process capability index of the target statistical value and enabling designation of the standard.

The generating section does not need to add the alteration to a process designated by the user among a plurality of processes in the target test.

According to a second aspect of the present invention, provided is a method. The method may comprise generating an altered test candidate obtained by adding an alteration shortening an execution time of a test to a target test for testing a device under test. The method may comprise causing a test apparatus to perform the altered test candidate on the device under test. The method may comprise comparing an altered test result of the device under test resulting from the altered test candidate to a target test result of the device under test resulting from the target test. The method may comprise judging whether the target test can be replaced by the altered test candidate, based on the comparison result of the comparison.

According to a third aspect of the present invention, provided is a computer-readable storage medium. The storage medium may store thereon a program that causes a computer to perform the method described above.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
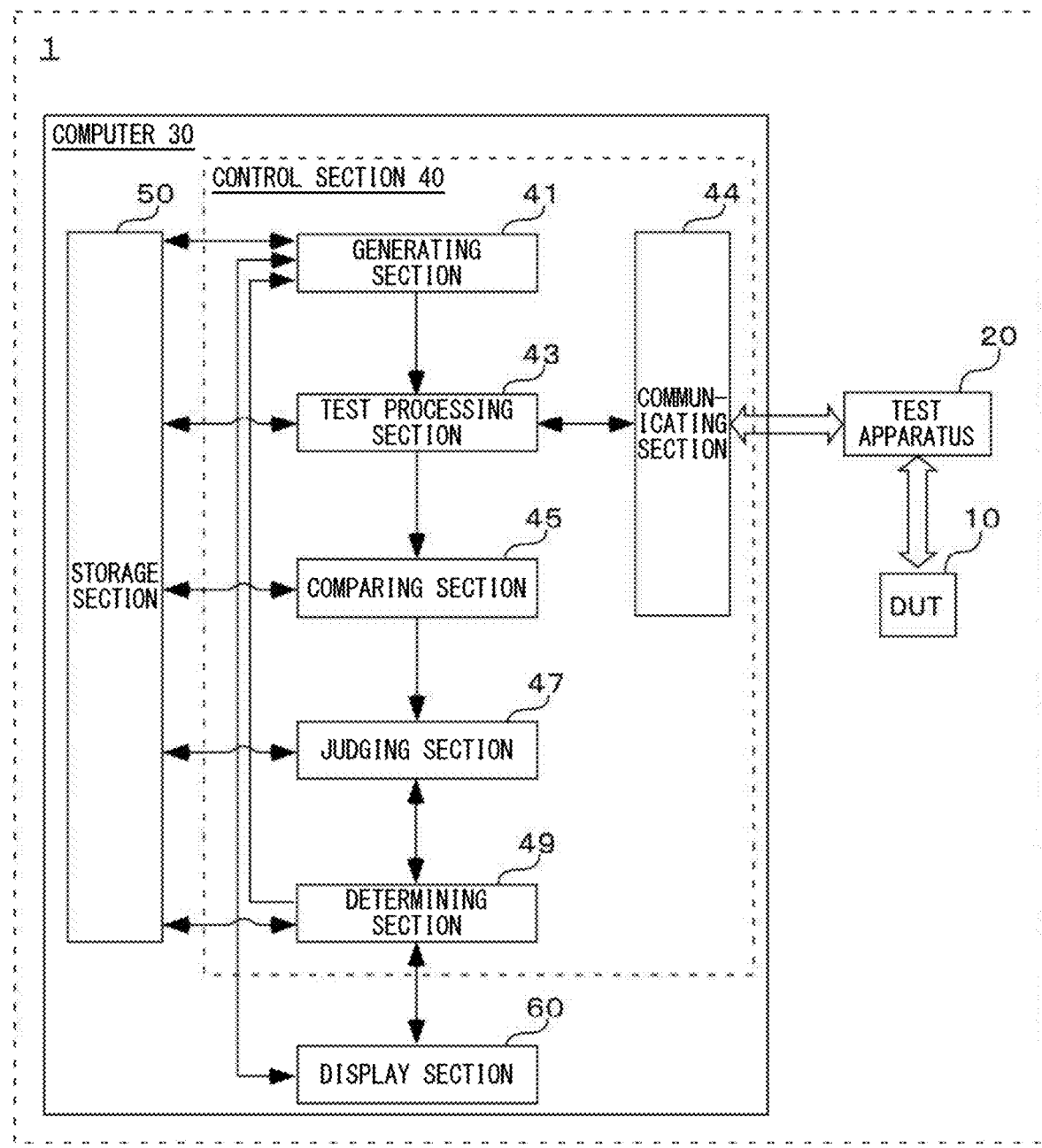
FIG. 1 shows a configuration of a test system 1 according to the present embodiment.

FIG. 1 shows a configuration of a test system 1 according to the present embodiment. The test system 1 includes a device under test (DUT 10), a test apparatus 20 that tests the DUT 10, and a computer 30 connected to the test apparatus 20 in a wireless or wired manner via a specialized or general communication network. The test system 1 may further include a performance board (PB) that connects the test apparatus 20 to the DUT 10.

The DUT 10 may be an SOC (System on Chip) or a memory. The DUT 10 may be a high-speed interface (IF) such as a PCIe, a device including an optical IF, or the like, for example. There may be a plurality of the DUTs 10 in the test system 1.

The test apparatus 20 is connected to the DUT 10 by a wire, provides a test signal to the DUT 10, and outputs to the computer 30 a response signal that is output from the DUT 10 in response to this test signal. The test apparatus 20 is a semiconductor test apparatus, for example, and may include a pattern generator, a timing generator, a waveform generator, a driver, a level comparator, a timing comparator, and the like. As an example, the pattern generator generates a test pattern that designates a waveform of the test signal to be provided to the DUT 10 and a test pattern that expresses an expected value of the response signal to be output from the DUT 10 in response to the DUT 10 being provided with the test signal. As another example, the pattern generator may generate timing information expressing a timing of a waveform change (edge) of the test signal and a comparison timing at which the response signal is compared with the expected value. The timing generator generates a timing signal that designates a timing at which a signal is to be received from the DUT 10, based on the timing information received from the pattern generator. The waveform generator generates the test signal in which the test pattern is formed, using the timing signal provided from the timing generator as a reference, for example. The driver supplies the DUT 10 with the test signal generated by the waveform generator, for example. The level comparator receives the response signal output from the DUT 10 in response to the test signal, and outputs a logic value signal expressing a logic value corresponding to the level of the received response signal, for example. The timing comparator acquires the logic value expressed by the logic value signal output by the level comparator, at the timing of the timing signal provided from the timing generator, for example. A relay for supplying power to the DUT 10 is provided between the DUT 10 and the test apparatus 20, and the power of the DUT 10 is turned OFF and ON by opening and closing this relay.

The computer 30 is an example of an apparatus, and may be used as a user interface of the test system 1, a general use computer, a specialized computer, another programmable data processing apparatus, a personal computer, a notebook computer, or a laptop computer, for example. The computer 30 may be formed integrally with the test apparatus 20, i.e. the computer 30 may be realized as a function of a test controller of the test apparatus 20.

The computer 30 has a testing tool capable of creating a test flow for testing at least one DUT 10 with the test apparatus 20 installed therein in advance. As an example, the computer 30 may continuously test a single DUT 10 or may continuously test a plurality of DUTs 10 in order, using the test apparatus 20. The computer 30 according to the present embodiment includes a control section 40, a storage section 50, and a display section 60. In a case where a plurality of types of DUTs 10 are to be tested, the computer 30 may include a control section 40 for each type of DUT 10, instead of a single control section 40.

The computer 30 is capable of generating a test to which an alteration shortening the test time has been added, by removing unnecessary operations or commands, adding new operations or commands, or the like in the testing of a DUT 10 according to a dynamic analysis, by using the testing tool. In the following description, there are cases where a test that is the target of such time-shortening is referred to as a target test, cases where a test that has had an alteration shortening the test time added thereto but has not been judged to be a replacement of the target test is referred to as an altered test candidate, and cases where a test that has had an alteration shortening the test time added thereto and has been judged to be a replacement of the target test is referred to as an altered test.

The computer 30 may determine, as conditions for using the testing tool described above, an environment that satisfies all of the following conditions (1) to (5). (1) The computer 30 is connected to the test apparatus 20 and the DUT 10. (2) The test can be performed repeatedly. (3) The target test result of the DUT 10 according to the target test satisfies a passing condition, i.e. the result is a pass. (4) The bin in a target test result of the DUT 10 according to the target test does not change when the target test is repeated. (5) The test is completed just by the execution of the test (e.g. this condition is not satisfied if temperature control is performed before starting the test). The bin mentioned above indicates a classification of the test result, and may be a plurality of values used to further classify the "pass" test results according to the capabilities of a CPU, which is an example of the DUT 10. The bin may be designated by a user.

The control section 40 according to the includes a generating section 41, a test processing section 43, a communicating section 44, a comparing section 45, a judging section 47, and a determining section 49. The control section 40 functions as each section indicated below, by executing the program described in this specification.

The generating section 41 according to the present embodiment generates an altered test candidate, obtained by adding an alteration that shortens the test execution time to a target test for testing the DUT 10. The generating section 41 according to the present embodiment automatically alters a parameter that is an optimization target in the target test for testing the DUT 10 from its initial value by performing a time-shortening algorithm on this parameter. In this way, the generating section 41 generates the altered test candidate obtained by adding an alteration shortening the test execution time to the target test. When setting information of the target test flow is input from the display section 60 by the user, the generating section 41 generates the target test corresponding to the input setting information and outputs this target test to the test processing section 43. It should be noted that the generating section 41 does not add an alteration to processes designated by the user among the plurality of processes in the target test, for example. Furthermore, the generating section 41 outputs the generated altered test candidate to the test processing section 43. Data for executing the time-shortening algorithm described above is stored in advance in the storage section 50, and the generating section 41 reads this data by referencing the storage section 50.

When the target test is input from the generating section 41, the test processing section 43 according to the present embodiment causes the test apparatus 20 to perform the target test on the DUT 10, via the communicating section 44. Furthermore, when the target test result is input from the communicating section 44, the test processing section 43 stores this target test result in the storage section 50. When the altered test candidate is input from the generating section 41, the test processing section 43 causes the test apparatus 20 to perform the altered test candidate on the DUT 10, via the communicating section 44. When the altered test result is input from the communicating section 44, the test processing section 43 stores the altered test result in the storage section 50 and also outputs instructions for comparing the target test result and the altered test result to the comparing section 45.

The communicating section 44 according to the present embodiment communicates with the test apparatus 20. The communicating section 44 transmits the target test input from the test processing section 43 to the test apparatus 20, and upon receiving the target test result of the DUT 10 resulting from the target test from the test apparatus 20, outputs the received target test result to the test processing section 43. Furthermore, the communicating section 44 transmits the altered test candidate input from the test processing section 43 to the test apparatus 20, and upon receiving the altered test result of the DUT 10 resulting from the altered test candidate from the test apparatus 20, outputs the received altered test result to the test processing section 43.

When the instructions described above are input from the test processing section 43, the comparing section 45 reads the altered test result of the DUT 10 resulting from the altered test candidate and the target test result of the device under test resulting from the target test from the storage section 50, and compares these test results to each other. The comparing section 45 outputs the result of this comparison to the judging section 47. The comparing section 45 according to the present embodiment may judge whether the altered test result described above and the target test result described above match, and may calculate the amount of change of the altered test result relative to the target test result, for example.

The comparing section 45 according to the present embodiment may compare an altered statistical value of a measured value obtained by repeatedly performing the altered test candidate on the DUT 10 to a target statistical value of a measured value obtained by repeatedly performing the target test on the DUT 10, for example. The comparing section 45 may calculate a process capability index of the altered statistical value described above and a process capability index of the target statistical value described above, using a process capability index that indicates a distribution of multiple measured values in a statistical value, and compare the process capability indexes to each other by checking the degree of matching between the two process capability indexes or calculating the amount of change in the process capability index of the altered statistical value relative to the process capability index of the target statistical value, for example. In a case where the test system 1 includes a plurality of the DUTs 10, the calculations of and comparisons between the respective process capability indexes may be performed for each DUT 10 or for the plurality of DUTs 10 together.

Here, the process capability index is the numerical value of the process capability that is the quality achievement capability of the process in the process being managed. There are cases where the process capability index is an indicator of what kind of distribution is formed by a plurality of measured values obtained by performing measurement a plurality of times, in which case the process capability index is indicated by Cp or Cpk. Cp or Cpk is a value that is inversely proportional to the magnitude of the variation of the measured values, i.e. a higher value when the variation of the measured values is lower. Cp or Cpk is also a value that is lower when the variance or standard deviation of the distribution of the plurality of measured values with respect to a range defined by an upper limit value and a lower limit value set in advance is greater.

As an example, the comparing section 45 according to the present embodiment may indirectly compare the altered test result of the DUT 10 resulting from the altered test candidate and the target test result of the DUT 10 resulting from the target test, by comparing a standard satisfied by the process capability index of the target statistical value described above to the process capability index of the altered statistical value described above. This standard may be designated by the user, and may be designated to be a standard index value of a process capability index, e.g. 1.33.

The comparing section 45 according to the present embodiment may also compare a first bin indicating the classification of the altered test result described above to a second bin indicating the classification of the target test result described above. For example, if the result of the comparison by the comparing section 45 is that the first bin described above differs from the second bin, it can be judged that the capability of the CPU has changed due to the target test having been changed to the altered test candidate, and that this altered test candidate is unsuitable.

The judging section 47 judges whether the target test can be replaced with the altered test candidate, based on the comparison result of the comparing section 45. The judging section 47 according to the present embodiment judges whether the target test can be replaced with the altered test candidate based on the comparison result between the altered test result of the DUT 10 resulting from the altered test candidate and the target test result of the DUT 10 resulting from the target test being input from the comparing section 45. The judging section 47 outputs this judgment result to the determining section 49.

The judging section 47 according to the present embodiment references a passing standard stored in the storage section 50 and judges whether the comparison result satisfies this passing standard, in response to the comparison result described above being input from the comparing section 45, for example. If the difference between the altered test result described above and the target test result described above satisfies the passing standard, e.g. if the altered test result matches the target test result or if the change amount of the altered test result relative to the target test result is within a predetermined range, the judging section 47 may judge that the target test can be replaced by the altered test candidate, for example. Furthermore, if the passing standard satisfied by the process capability index of the target statistical value described above is satisfied by the process capability index of the altered statistical value described above, using the process capability indexes described above, the judging section 47 may judge that the target test can be replaced with the altered test candidate, for example. As a more specific example, if the change amount of the process capability index of the altered test result is less than or equal to 0.1 relative to the process capability index of the target test result, the judging section 47 may judge that the target test can be replaced by the altered test candidate. As another specific example, if the passing standard satisfied by the process capability index of the target test result, e.g. a standard of the process capability index being greater than or equal to 1.33, is satisfied by the process capability index of the altered test result, the judging section 47 may judge that the target test can be replaced by the altered test candidate.

If the comparison result described above input from the comparing section 45 indicates that the first bin indicating the classification of the altered test result described above is the same as the second bin indicating the classification of the target test result described above, the judging section 47 according to the present embodiment may judge that the target test can be replaced by the altered test candidate.

The determining section 49 according to the present embodiment determines whether to generate another altered test candidate with the generating section 41, in response to the judgment result from the judging section 47 being input. For example, the determining section 49 may determine whether to generate another altered test candidate according to whether all of the alteration parameters for shortening the test execution time of the target test, which are calculated based on the setting information of the altered test flow input by the user or on a specific algorithm, have been used.

If it is determined that the generating section 41 is to generate another altered test candidate, the determining section 49 according to the present embodiment outputs instructions to the generating section 41 to repeat the series of processes described above. The determining section 49 according to the present embodiment outputs each altered test result and the corresponding judgment results by the judging section 47 to the display section 60 to be displayed, and stores each altered test result, the corresponding judgment results, and the like in the storage section 50.

The determining section 49 determines an altered test candidate having the shortest execution time, from among the plurality of altered test candidates judged by the judging section 47 as being capable of replacing the target test among the plurality of altered test candidates generated by the generating section 41, to be an altered test for replacing the target test. The determining section 49 according to the present embodiment determines the altered test candidate having the shortest execution time to be the altered test for replacing the target test, by referencing a plurality of altered test results resulting from the plurality of altered test candidates stored in the storage section 50 that satisfy the passing standard, and outputs information concerning the determined altered test to the display section 60. On a condition that the execution time of an altered test candidate judged to be able to replace the target test by the judging section 47 among the plurality of altered test candidates generated by the generating section 41 is less than or equal to a predetermined objective time, the determining section 49 may end the repetition of the series of processes described above and determine the altered test candidate satisfying this condition to be the altered test for replacing the target test. This objective time is designated be the user, for example, and the details of this designation method by the user are described further below using FIG. 4.

The display section 60 is a graphical user interface (GUI) of the computer 30, for example, and the user can set (program) the content of a test flow via the GUI. In the manner described above, when the comparing section 45 according to the present embodiment compares the standard satisfied by the process capability index of the target statistical value described above to the process capability index of the altered statistical value described above, the display section 60 may display to the user the process capability index of the target statistical value described above and a screen for designating this standard.

Figure 2:
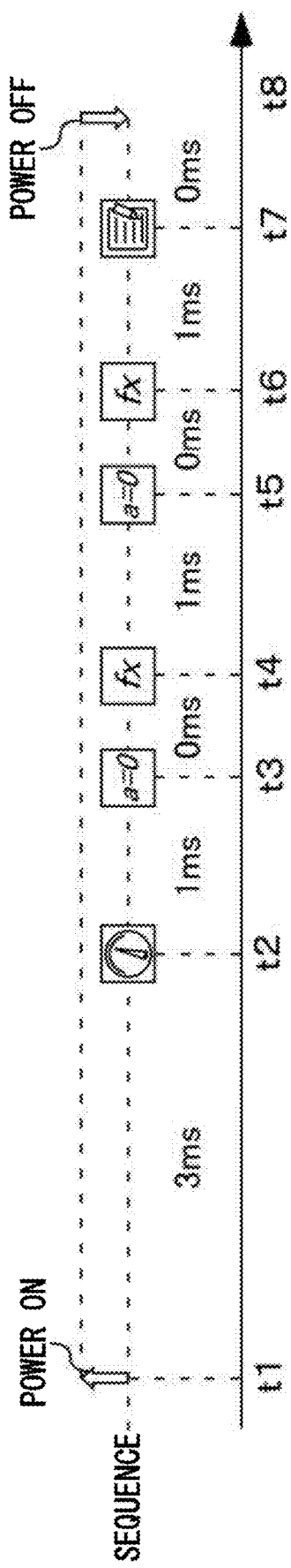
FIG. 2 is a diagram for describing the GUI according to the present embodiment.

FIG. 2 is a diagram for describing the GUI according to the present embodiment. A graph of the test sequence included in the altered test candidate is displayed in the GUI, wherein the horizontal axis of the graph is the time axis and a plurality of process elements performed by the test apparatus 20 and the computer 30 in accordance with the test sequence are positioned in a timing chart arranged parallel to the time axis. An element indicated by fx in a square box is shown as an example of such a process element, and when the process of the element fx is performed, a computation of an arbitrary function in a text format expected by the user is performed. As an example, each element can be arranged arbitrarily in a timing chart by the user, each element can be clicked on to program the contents thereof, the distance between elements can be set as the execution time interval between the process elements, and this execution time interval can be displayed in the timing chart. Furthermore, in this case, as an example, if an execution time interval is designated in advance, each element can be moved to a position corresponding to the designated time even if the element is appropriately arranged on the timing chart, as long as the order of the elements is maintained. Furthermore, for the execution time interval of the process of each element arranged in the timing chart, it may be possible to set a time interval designated by the user for only the execution time intervals between specific processes, and to set the execution time intervals between other processes to be fixed intervals, e.g. 5 ms. If the time from when the power source of the DUT 10 is turned ON to when the measurement is started, such as the settling time, is set by a test rule, adjustment of this time may be prohibited.

Figure 3:
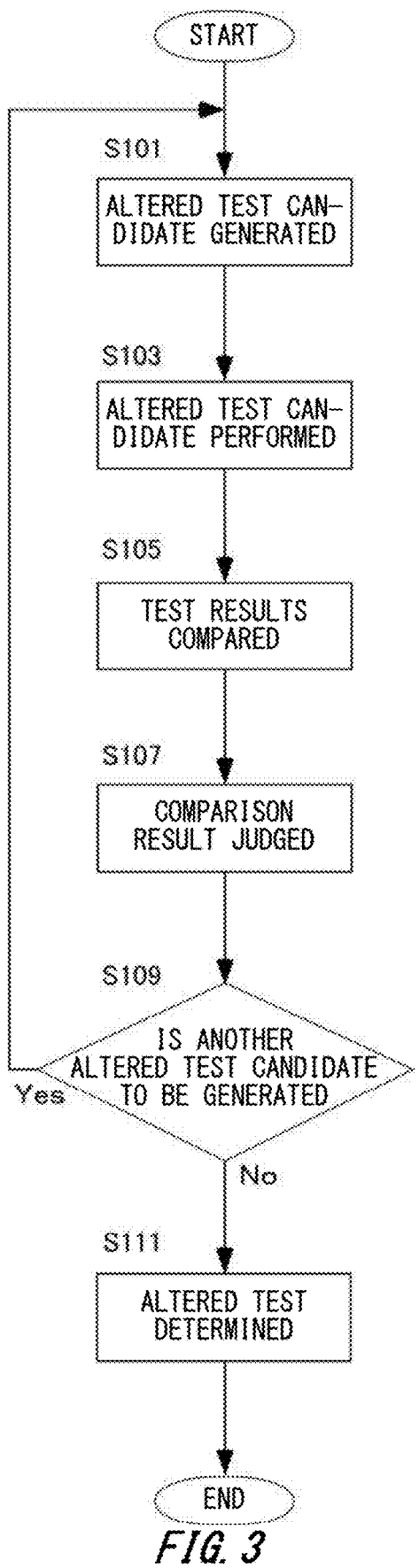
FIG. 3 shows an operational flow of the computer 30 according to the present embodiment.

FIG. 3 shows an operational flow of the computer 30 according to the present embodiment. This flow is started by the testing tool installed in the computer 30 being activated, for example.

The computer 30 generates an altered test candidate obtained by adding an alteration that shortens the test execution time to the target test for testing the DUT 10 (step S101). At step S101, the computer 30 displays the altered test candidate in an information input screen in the GUI, enables the user to input the setting information described above, and generates the altered test candidate based on this setting information, for example.

The computer 30 according to the present embodiment uses the generating section 41 to automatically alter a parameter that is an optimization target in the target test for testing the DUT 10, by performing a time-shortening algorithm that optimizes the automatic power OFF, optimizes the power ON, eliminates wait time, or optimizes the wait time, for example.

The automatic power OFF optimization includes deactivating unnecessary automatic power OFF processes, for example. The power ON optimization includes, in a case where a relay closing process and the power ON process are performed together in order among a plurality of output channels or with one output channel during the target test, separating each process and performing a plurality of processes for closing the relays between a plurality of output channels in parallel, or reducing the number of times the plurality of processes for closing the relays are performed with a single output channel, and repeatedly performing the power ON process and the power OFF process with the relay in a closed state. The elimination of the wait time includes eliminating unnecessary time intervals, for example. The optimization of the wait time includes optimally reducing time intervals, for example.

After causing the test apparatus 20 to perform the target test on the DUT 10 and acquiring the target test result, the computer 30 causes the test apparatus 20 to perform the altered test candidate on the DUT 10 (step S103). At step S103, the computer 30 causes the test apparatus 20 to repeatedly perform the altered test candidate on each DUT 10 a number of times making it possible to judge that there is statistically no effect on the test result, e.g. 100 times, based on the setting information described above or on the specific algorithm, for example.

The computer 30 compares the altered test result, received from the test apparatus 20, of the DUT 10 resulting from the altered test candidate to the target test result, acquired in advance, of the DUT 10 resulting from the target test (step S105). At step S105, the computer 30 compares the altered statistical value of the measured values acquired by repeatedly performing the altered test candidate on the DUT 10 and the target statistical value of the measured values acquired by repeatedly performing the target test on the DUT 10, for example.

At step S105, the computer 30 may calculate the process capability index of the altered statistical value and the process capability index of the target statistical value, and compare these process capability indexes to each other. With the time-shortening algorithms such as the automatic power OFF optimization, power ON optimization, and wait time elimination algorithms, the possibility of affecting the test result is low, but with the wait time optimization algorithm, the settling times of a plurality of processes included in the target test are adjusted, and therefore there is a high possibility that there will be a small effect on the test result that changes the process capability index. Furthermore, from a different viewpoint, there are cases where the usability decreases due to the user setting many values concerning the process capability index before performing the process capability index comparison. One example of a value set by the user before the process capability index comparison is performed is the process capability index for each test item. It is possible that a different process capability index is needed for each test item, and since there are an extremely large number of test items in a large program, a large amount of work is performed by the user to set the process capability indexes. From this viewpoint, the computer 30 preferably performs the process capability index comparison for only the altered test results obtained by performing the wait time optimization algorithm, among the time-shortening algorithms.

The computer 30 judges whether the target test can be replaced by the altered test candidate, based on the comparison result from the comparison of step S105 (step S107). At step S107, if the difference between the altered test result described above and the target test result described above satisfies the passing standard, e.g. if the altered test result and the target test result match, the computer 30 judges that the target test can be replaced with the altered test candidate, for example.

The computer 30 determines whether to generate another altered test candidate (step S109). At step S109, the computer 30 determines whether to generate another altered test candidate according to whether all of the altered parameters for shortening the test execution time of the target test, which are calculated based on the setting information input by the user or on the specific algorithm, have been used, for example.

If it is determined at step S109 that another altered test candidate is to be generated (step S109: Yes), the computer 30 returns to step S101 and repeats steps S101 to S109. It should be noted that during this repetition, at step S103, the acquisition of the target test result obtained by causing the test apparatus 20 to perform the target test on the DUT 10 may be omitted. Furthermore, in the case of step S109: Yes, the computer 30 according to the present embodiment displays the altered test result and the judgment result of step S107 in the GUI, and stores the altered test result, the judgment result, and the like in the storage section 50.

If it is determined at step S109 that another altered test candidate is not to be generated (step S109: No), the computer 30 determines the altered test candidate having the shortest execution time, from among the plurality of altered test candidates judged to be capable of replacing the target test among the plurality of altered test candidates, to be the altered test to replace the target test (step S111), displays information concerning the determined altered test in the GUI, and ends this flow. At step S109, the computer 30 may determine whether to generate another altered test candidate by judging whether the execution time of the altered test candidate determined to be capable of replacing the target test, among the plurality of altered test candidates, is less than or equal to a predetermined objective time. In this case, if it is judged that the execution time of this altered test candidate is less than or equal to the objective time, the determining section 49 determines that another altered test candidate is not to be generated (step S109: No), and at step S111, may determine this altered test candidate whose execution time is less than or equal to the objective time to be the altered test for replacing the target test.

In the flow described above, if the determining section 49 determines that another altered test candidate is to be generated at step S109 (step S109: Yes) in response to the judging section 47 judging that the difference described above satisfies the passing standard at step S107, the generating section 41 according to the present embodiment may generate a new altered test candidate obtained by adding an alteration that further shortens the execution time of the altered test candidate, for example. Furthermore, if the determining section 49 determines that another altered test candidate is to be generated at step S109 (step S109: Yes) in response to the judging section 47 judging that the first bin indicating the classification of the altered test result described above and the second bin indicating the classification of the target test result are the same at step S107, the generating section 41 according to the present embodiment may generate a new altered test candidate obtained by adding an alteration that further shortens the execution time of the altered test candidate, for example.

There are cases where the specifics of each step in the flow described above change due to the time-shortening algorithm or the like performed by the computer 30. For example, as described above, the comparison between the process capability indexes of the altered test results of the DUT 10 resulting from the altered test candidate and the target test results of the DUT 10 resulting from the target test at step S105 is preferably performed for the altered test results obtained by performing the wait time optimization algorithm.

In this way, the computer 30 generates the altered test candidate by analyzing the target test of the DUT 10 and shortening or eliminating redundant portions. The computer 30 performs actual testing of the DUT 10 with the altered test candidate. If the test result obtained from the altered test candidate is the same as the test result resulting from the target test before shortening the redundant portions or the like, the computer 30 judges that the test result is not negatively affected by the shortening of the redundant portions or the like and generates another altered test candidate obtained by further shortening the redundant portions or the like in this altered test candidate. In this way, the computer 30 shortens the test time by dynamically optimizing the test. Therefore, it is possible for the computer 30 to improve not only items that can be logically confirmed, but also items that cannot be logically confirmed, through trial and error performed by adjusting analog values, e.g. the time axis, for the items that cannot be logically confirmed.

Figure 4:
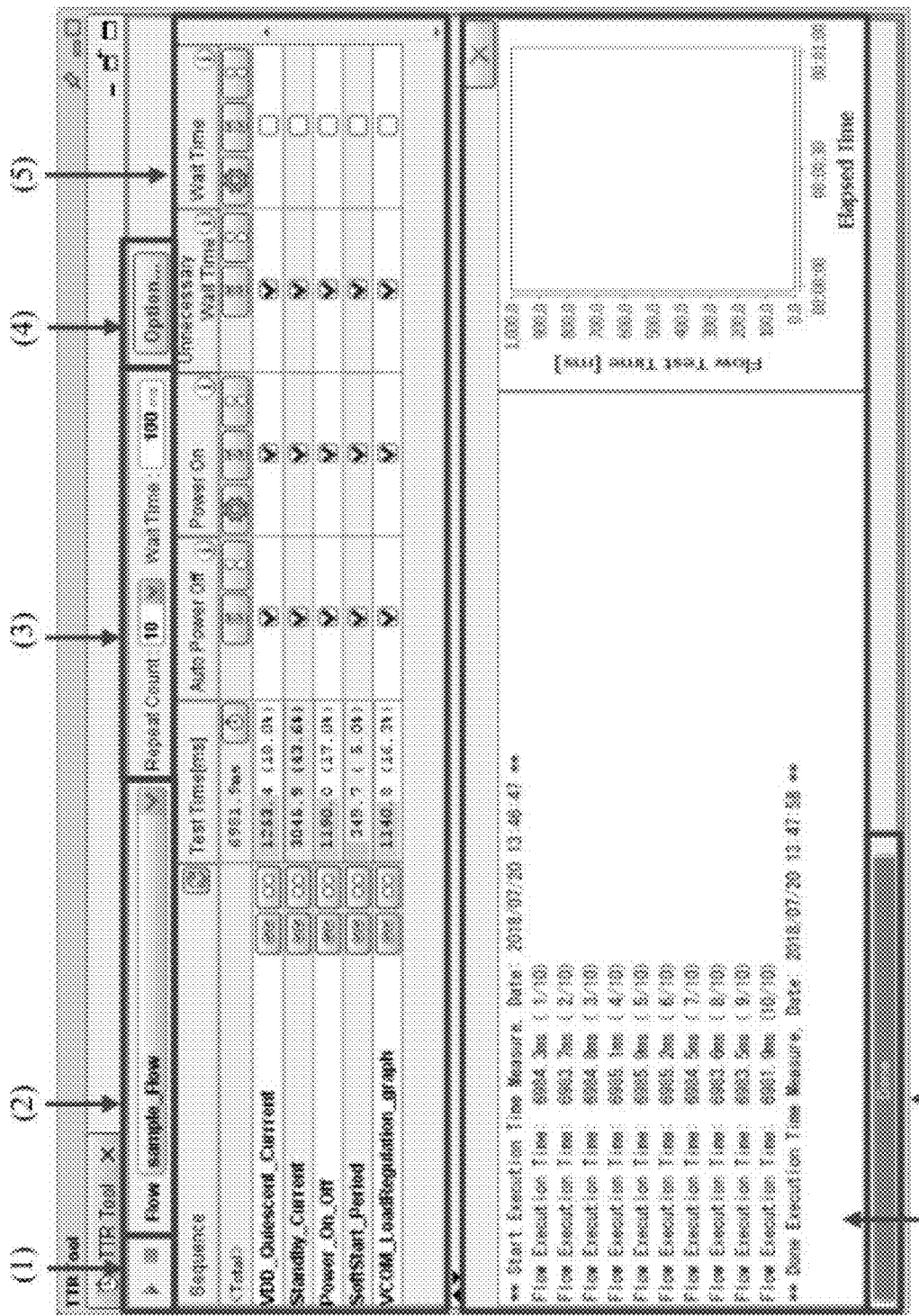
FIG. 4 is an example of a main screen displayed in the display section 60 according to the present embodiment.

FIG. 4 is an example of a main screen displayed in the display section 60 according to the present embodiment. In order to describe the main screen, the main screen is divided by frames into a plurality of areas, and each area is indicated by an arrow from (1) to (7). The main screen is used in step S101 described above, for example.

A start button and a stop button are displayed in area (1). When the start button is clicked by the user, the performance of the target test optimization is started. When the stop button is clicked by the user, the altered test candidate being performed is stopped after reaching the end of this performance.

A target test selection button is displayed in area (2). When this selection button is clicked by the user, a pulldown menu is displayed, and one target test among a plurality of target tests is selected by the user.

A repetition setting area that includes a selection button for the number of repetitions and a field for inputting the wait time of the altered test candidate to be repeated is displayed in area (3). When the selection button is clicked by the user, a pulldown menu is displayed, and the user selects one number of repetitions from among a list of a plurality of numbers of repetitions in the pulldown menu. The list of the plurality of numbers of repetitions in the pulldown menu includes choices of 10, 20, 30, . . . , 90, and 100, for example. One or more integer values may be input directly by the user into the field displaying the number of repetitions to the side of the selection button. Here, 100 ms is set as an initial value in the field for inputting the wait time of the altered test candidate to be repeated, and the user inputs the wait time of the altered test candidate to be repeated in [ms] units.

An option button is displayed in area (4). When the option button is clicked by the user, an option dialog box is opened, a checkbox for designating whether to set an objective time when optimizing the target test and a selection button for the objective time when optimizing the target test, for example, are displayed in this option dialog box, and if the checkbox is checked, the optimization is ended on a condition that the execution time of the altered test candidate has become less than or equal to the objective time selected using the selection button. In other words, if the user has set the objective time and checked the checkbox, the execution time of the test is shortened to the objective time, but not shortened beyond the objective time. The objective time may be set for each target test. Furthermore, the testing tool may have a similar function to have the user selectively input the objective time such that the objective time is set in a specific range on the time axis in a series of target tests not set within another range.

An optimization setting table is displayed in area (5). The specifics of this optimization setting table are described in FIG. 5.

A log display area including a text log display area, a graph log display area, and a clear button is displayed in area (6). In the text log display area, a log of the execution times output due to the altered test candidate being performed on the DUT 10, results (a log) indicating what type of process (event) was optimized, and the like are displayed in a text format, for a certain number of repetitions. In the graph log display area, the plurality of execution times displayed in the log display area are shown by a line graph. This operation is included in step S103 described above, for example. The vertical axis of the graph indicates the execution time of the altered test candidate in [ms] units, and the horizontal axis indicates the time from the start to the end of the optimization. In the graph log display area, the line graph may be displayed with a different color for each type of time-shortening algorithm, e.g. each of the four algorithms for optimizing the automatic power ON, optimizing the power OFF, eliminating unnecessary wait time, and optimizing the wait time. The clear button is indicated by x, and when the clear button is clicked by the user, the displays in each of the text log display area and the graph log display area are deleted (cleared).

A progress bar is displayed in area (7). The characters "Done" indicating that the altered test candidate of the DUT 10 has finished, the characters "Running-Power On Optimization (50.0%)" indicating that the power ON optimization progress is at 50%, or the like are displayed in the progress bar, for example.

Figure 5:
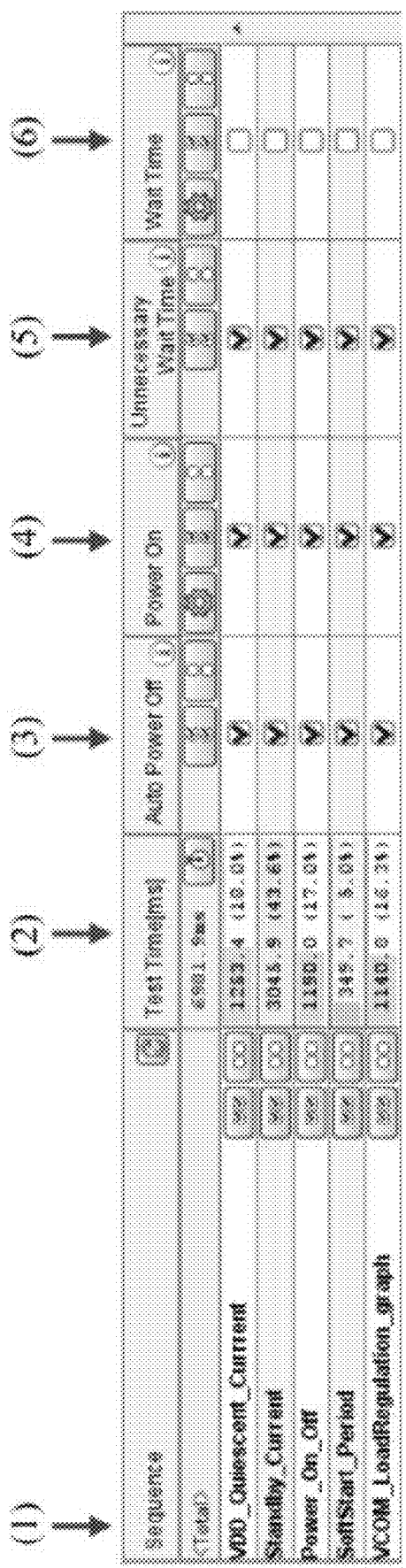
FIG. 5 is an example of the optimization setting table in the main screen displayed in the display section 60 according to the present embodiment.

FIG. 5 is an example of the optimization setting table in the main screen displayed in the display section 60 according to the present embodiment. The optimization setting table is shown as a 7-row by 6-column matrix, and each column is indicated by an arrow from (1) to (6) in order to describe the optimization setting table. This optimization setting table is used in step S101 described above, for example.

A sequence name list is displayed in column (1), and as an example, a list of a plurality of test sequences registered in the target test selected in area (2) of the main screen of FIG. 4 is displayed in column (1). The testing tool may include a function (flow editor) allowing the user to input selections to enable and execute the plurality of test sequences registered in the target test, in which case only the enabled test sequences need to be displayed in the sequence name list. It should be noted that if the same test sequence is designated a plurality of times, the name does not need to be displayed for the second and following test sequences.

A refresh button indicated by two arcing arrows is arranged in the first row of column (1), and when the refresh button is clicked by the user, the change performed by the flow editor described above is reflected in the table. Furthermore, when the refresh button has been clicked, the setting state of the time-shortening algorithm for the existing test sequence may be saved, and the execution time may be cleared. A full-row selection button and a full-row deselection button, for selecting or deselecting, all at once, whether all of the time-shortening algorithms in each test sequence in columns (3) to (6) are to be executed, are arranged to the side of each sequence in column (1).

The measured test execution time is displayed in [ms] units in column (2). The execution time of the target test, which is the total execution time of the plurality of sequences, is displayed in the second row of column (2). An execution time measurement button is displayed as an image of a clock to the side of this execution time, and when the execution time measurement button is clicked by the user, the target test is performed. After the execution time measurement button has been clicked, the execution of the target test is stopped when the stop button displayed in area (1) of the main screen of FIG. 4 is clicked.

The execution time of each test sequence is displayed in the third to seventh rows of column (2), and a ratio of this execution time to the execution time of the target test displayed in the second row is displayed in parentheses in [%] units, to the side of the execution time. The execution time of each test sequence is an average value obtained by repeating the test sequence the number of times set in the repetition setting area shown in area (3) of the main screen of FIG. 4, and if the same test sequence is executed a plurality of times, the integrated value thereof may be displayed.

In order from column (3) to column (6), the checkboxes for respectively selecting whether to apply the automatic power OFF optimization, the power ON optimization, the wait time elimination, and the wait time optimization are arranged in the third to seventh rows where the respective test sequences are displayed, and the user can set which of these four algorithms are to be performed independently for each test sequence. In other words, the user can designate, for each test sequence, that alterations shortening the test execution time using the respective time-shortening algorithms are not to be added to this test sequence. As an example, in the initial state, the checkboxes of the test sequence rows are checked for the three time-shortening algorithms for the automatic power OFF optimization, the power ON optimization, and the wait time elimination, and none of the checkboxes of the test sequence rows are checked for the wait time optimization algorithm.

A full-column selection button and a full-column deselection button, for selecting or deselecting, all at once, whether each time-shortening algorithm is to be executed for all of the test sequences, are arranged in the second row of each of column (3) to column (6). Furthermore, a setup button shown as an image of a gear is further arranged in the second row of each of column (4) and column (6), and when one of these setup buttons is clicked by the user, a setting dialog box of the corresponding time-shortening algorithm is displayed.

Concerning the automatic power OFF optimization described above, an automatic power OFF process is a process that is set in advance for each of the plurality of test sequences included in the target test of the DUT 10, and automatically turns OFF the power source of the DUT 10 every time one test sequence ends, for example. The automatic power OFF process is set in the initial state to be performed on the DUT 10 every time each test sequence ends, but if the user wants to test the DUT 10 in a state where the internal state of the DUT 10 has been reset, wants to confirm the trend of the DUT 10 immediately after activation of the power source, or the like, the automatic power OFF process may be set to be performed deliberately by the user. The computer 30 may turn OFF the power source of the DUT 10 by causing the test apparatus 20 to stop the power being supplied to the DUT 10 from a power source pin, for example.

The generating section 41 according to the present embodiment shortens the test execution time by applying the automatic power OFF optimization algorithm that includes deactivating the automatic power OFF process described above to the target test, for example. More specifically, the generating section 41 shortens the execution time of the target test by omitting the time needed for opening and closing the relays for supplying power to the DUT 10 and the time needed for turning ON/OFF the power source of the DUT 10, by applying the automatic power OFF optimization algorithm to a test sequence of the target test and, after this test sequence has ended, starting the next test sequence while each power source of the DUT 10 remains ON. Furthermore, in this case, the judging section 47 according to the present embodiment judges whether there is a negative effect on the altered test result acquired by performing the altered test candidate, which is generated by applying the automatic power OFF optimization algorithm to the target test, on the DUT 10. More specifically, if the altered test result from the DUT 10 indicates a pass or that the bin has not changed from before the alteration even when this altered test candidate is repeatedly performed on the DUT 10, the judging section 47 judges that there was no negative effect on the altered test result, and judges that the automatic power OFF process described above is unnecessary, for example.

Figure 6:
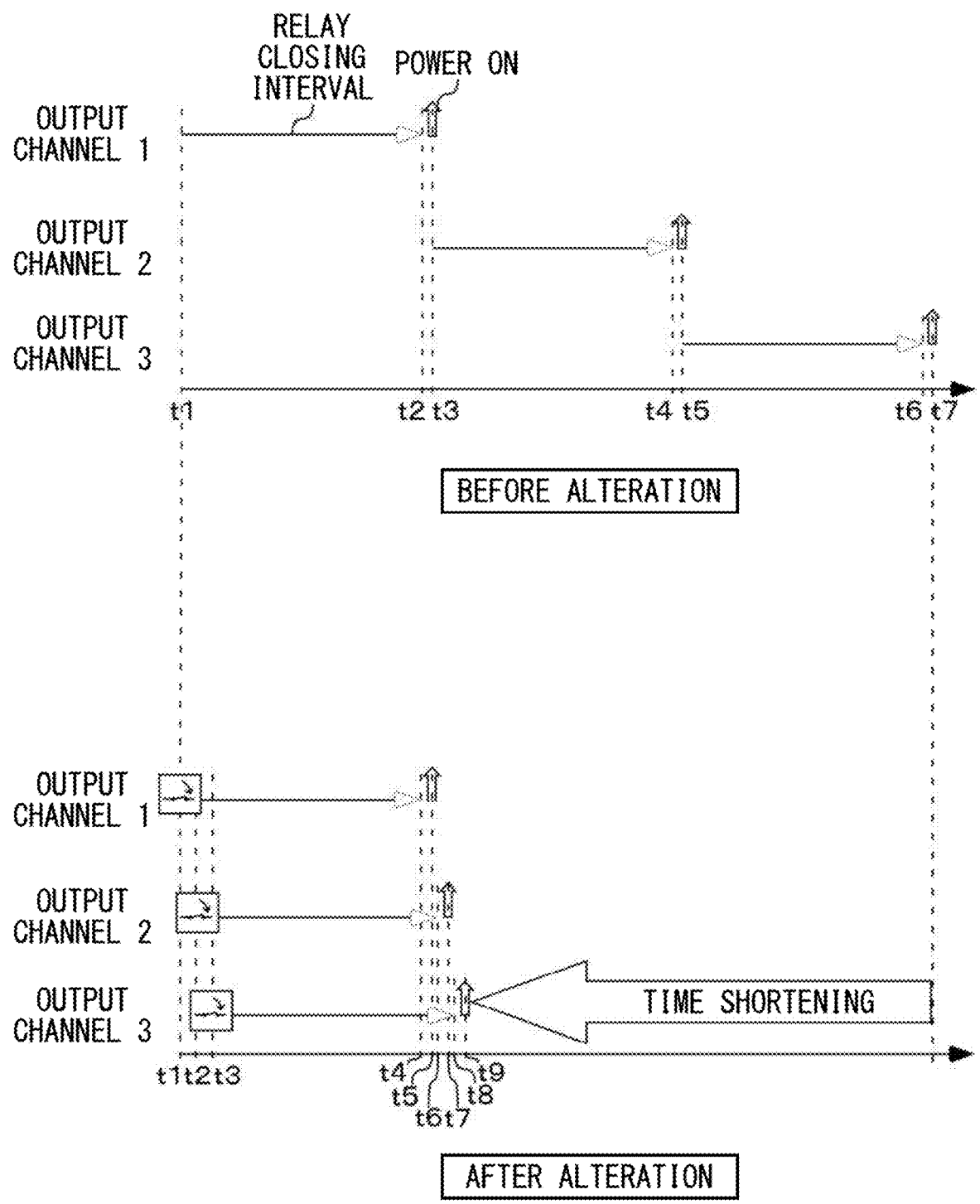
FIG. 6 is a graph describing an example of the power ON optimization algorithm according to the present embodiment.

FIG. 6 is a graph describing an example of the power ON optimization algorithm according to the present embodiment. The upper portion of FIG. 6 shows a graph before the alteration shortening the test execution time using the power ON optimization algorithm is added, and the bottom portion of FIG. 6 shows a graph after this alteration is added. In each graph, the horizontal axis is the time axis and an output channel 1, an output channel 2, and an output channel 3 of the target test are shown in order from the top.

The generating section 41 according to the present embodiment shortens the test execution time by applying, to the target test, the power ON optimization algorithm that includes setting the plurality of processes closing the relays for supplying power to the DUT 10 to be performed in parallel in the target test, for example. More specifically, the generating section 41 applies the power ON optimization algorithm to the target test, separates the processes for closing the relays from the power ON processes in the target test, and performs the plurality of processes for closing the relays among a plurality of output channels in the target test, thereby eliminating the standby time during which a process for closing a relay in one output channel is in standby without starting until the power ON process in another output channel is completed, to shorten the execution time of the target test. Instead of this, the generating section 41 may shorten the test execution time by applying, to the target test, the power ON optimization algorithm that includes setting the process of turning ON the power source and the process of turning OFF the power source of the DUT 10 to be performed repeatedly with the relays in a closed state in the target test, for example. More specifically, the generating section 41 may apply the power ON optimization algorithm to the target test to separate the processes for closing the relays from the power ON processes in the target test, reduce the number of the plurality of processes for closing the relays in the target test, and repeatedly perform the power ON process and the power OFF process in a state where the relays are closed, thereby eliminating the time for performing the relay closing process and the relay opening process, i.e. the time needed to close the relays and the time needed to open the relays, to shorten the execution time of the target test. It should be noted that in both cases, if there is an order to the power ON processes designated by the user among the plurality of output channels or in a single output channel, the power ON optimization algorithm has maintaining this order as a condition. In the following description relating to the power ON optimization algorithm as well, this condition is assumed to be satisfied, and descriptions to that effect are omitted. Furthermore, the generating section 41 does not add the alteration of the power ON optimization algorithm to processes designated by the user, among the plurality of processes for closing the relays in the target test.

In the graph before the alteration in the top portion of FIG. 6, the process for closing the relay of the output channel 1 is started at the timing t1, this process ends at the timing t2, the power ON process of the output channel 1 is performed and the process for closing the relay of the output channel 2 is started at the timing t3, and after this, similar processes are repeated for the output channel 2 and the output channel 3 from the timing t3 to the timing t7.

As shown in the graph before the alteration in the top portion of FIG. 6, in the target test before the power ON optimization algorithm is applied, the power ON process and the relay closing process in each of the plurality of output channels are integrated power ON events. When the user arranges power ON event elements in the timing chart of the GUI, an interval is automatically set. If these power ON events are designated continuously among the plurality of output channels, the plurality of power ON events are performed sequentially, such that the power ON event of a subsequent output channel is started after waiting for the relay closing interval, which is the time needed to close the relay in the power event of the previous output channel.

On the other hand, in the graph after the alteration in the bottom portion of FIG. 6, the relay closing process of the output channel 1 is started at the timing t1, the relay closing process of the output channel 2 is started at the timing t2, and the relay closing process of the output channel 3 is started at the timing t3. Then, the relay closing process of the output channel 1 is finished at the timing t4, the power ON process of the output channel 1 is performed at the timing t5, the relay closing process of the output channel 2 is finished at the timing t6, the power ON process of the output channel 2 is performed at the timing t7, the relay closing process of the output channel 3 is finished at the timing t8, and the power ON process of the output channel 3 is performed at the timing t9.

In this case, the judging section 47 according to the present embodiment judges whether there is a negative effect on the altered test result acquired by performing the altered test candidate, generated by applying the power ON optimization algorithm to the target test, on the DUT 10. More specifically, if the altered test result from the DUT 10 indicates a pass or that the bin has not changed from before the alteration even when this altered test candidate is repeatedly performed on the DUT 10, the judging section 47 judges that there was no negative effect on the altered test result, and judges that this power ON process is unnecessary, for example. After this, cases where the power ON algorithm is applied to the target test are the same as above, and descriptions thereof are omitted.

If the target test includes six output channels, among which the timings of power ON events in three of the output channels and the timings of the power events in the other three output channels are different from each other, the power ON optimization algorithm may independently set the performance of the plurality of processes for closing the relays among the former three output channels in parallel and the performance of the plurality of processes for closing the relays among the latter three output channels in parallel, for example. Furthermore, the power ON optimization algorithm may be set to execute the plurality of processes for closing the relays among two of three output channels in a case where the target test includes three output channels, for example.

Figure 7:
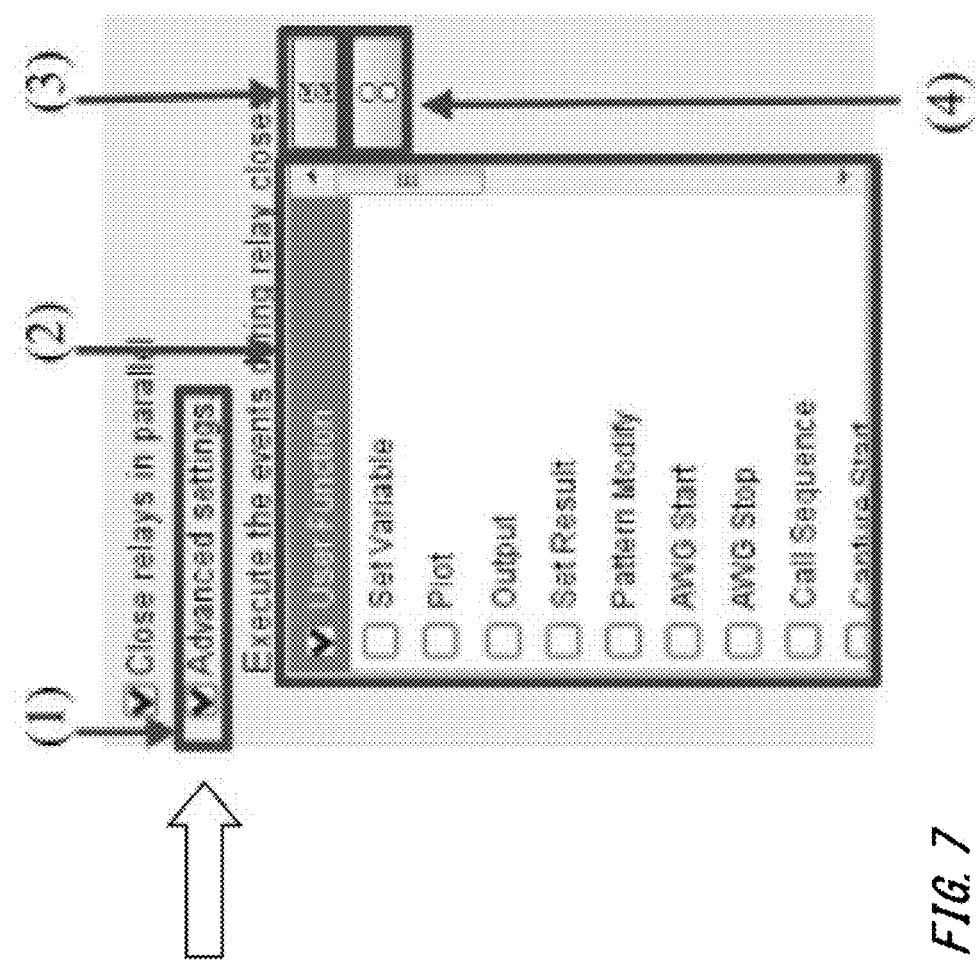
FIG. 7 is an example of a setting dialog screen concerning the power ON optimization algorithm, displayed in the display section 60 according to the present embodiment.
Figure 7:
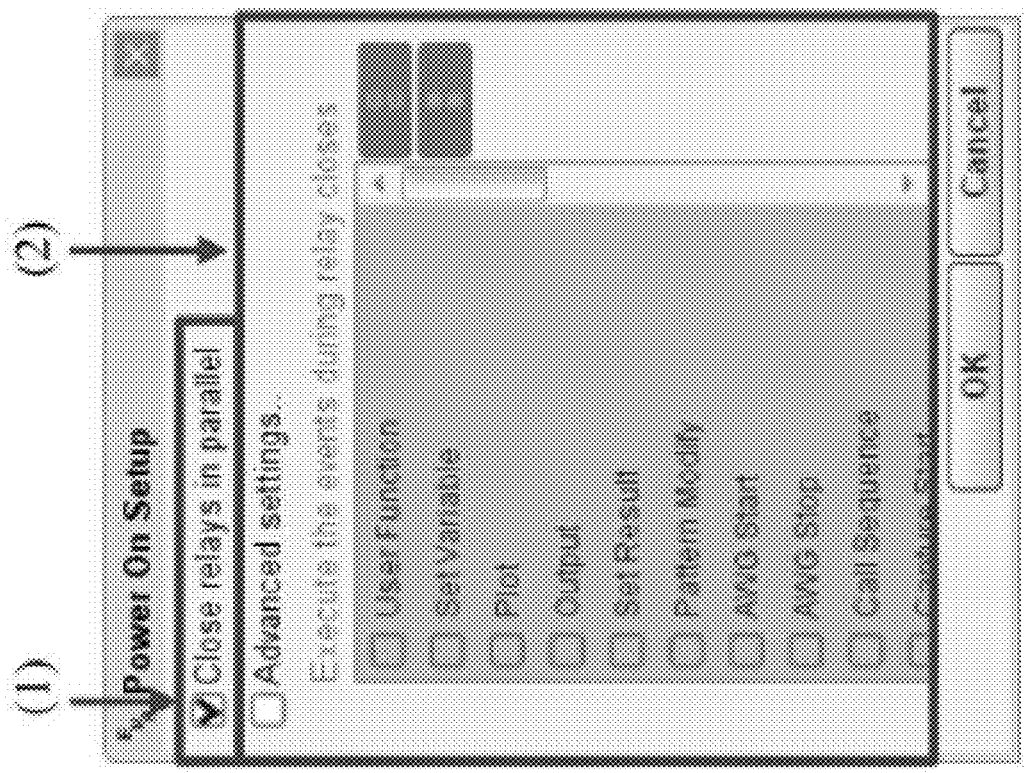

FIG. 7 is an example of a setting dialog screen concerning the power ON optimization algorithm, displayed in the display section 60 according to the present embodiment. Portion [A] on the left side of FIG. 7 shows a screen opened in the optimization setting table in area (5) of the main screen of FIG. 4 in response to the setup button arranged in the column of the power ON optimization being clicked, and portion [B] on the right side of FIG. 7 shows a screen of a state transitioned to from the screen of portion [A] due to user input. In order to describe portion [A], a plurality of areas in the screen of portion [A] are divided by frame lines, and these areas are respectively indicated by arrows (1) and (2). Similarly, in order to describe portion [B], a plurality of areas in the screen of portion [B] are divided by frame lines, and these areas are respectively indicated by arrows (1) to (4).

In the screen of portion [A], the checkbox in which the user makes the designation for performing the relay closing processes in parallel is displayed in area (1), and checkboxes and the like in which the user makes advanced settings enabling the individual designation of one or more other types of processes that may be performed in parallel with the relay closing processes are displayed in area (2).

In the screen of portion [B], the checkboxes in which the user makes the advanced settings described above are displayed in area (1), and a field for selecting the other processes to be activated if the checkboxes of area (1) are checked is displayed in area (2). In the state shown in the drawing, only the checkbox of "User Function" is checked. Furthermore, a batch selection button for selecting all of the processes listed in area (2) at once is displayed in area (3), and a batch deselection button for deselecting all of the processes listed in area (2) at once is displayed in area (4).

Figure 8:
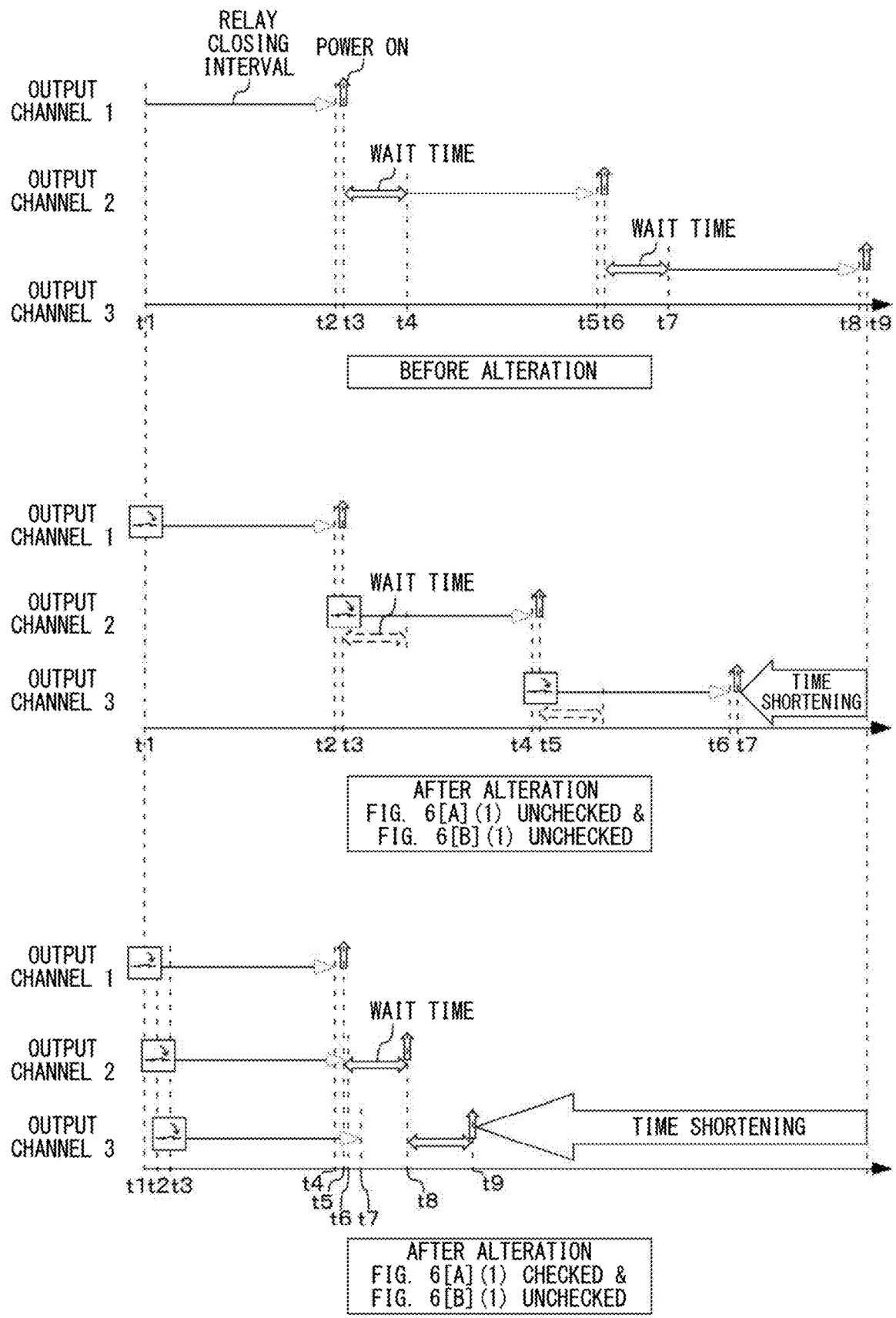
FIG. 8 is a graph describing an example of the power ON optimization algorithm according to the present embodiment.
Figure 9:
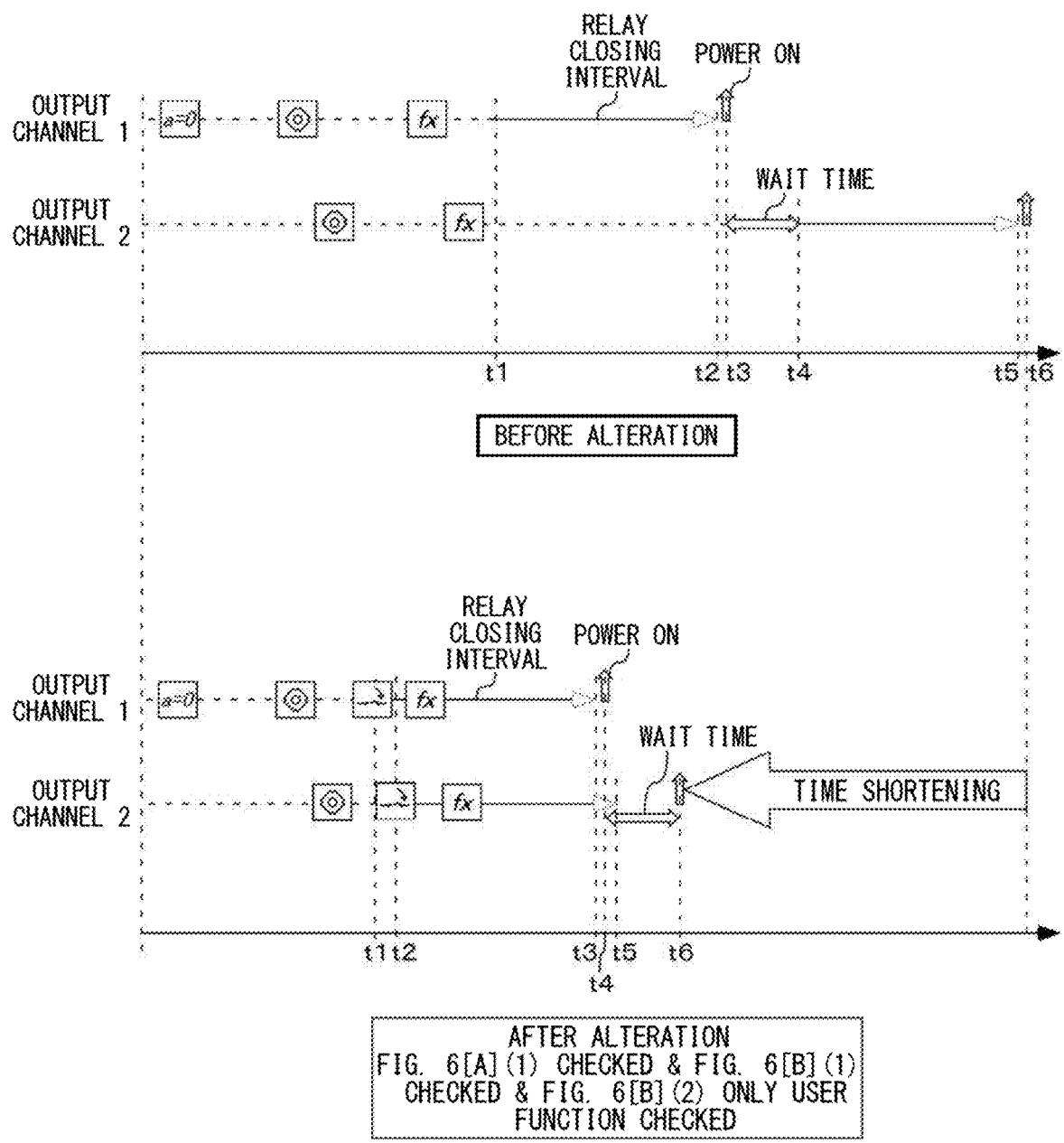
FIG. 9 is a graph describing an example of the power ON optimization algorithm according to the present embodiment.

FIGS. 8 and 9 are graphs for describing examples of the power ON optimization algorithm according to the present embodiment. In FIGS. 8 and 9, the specifics of the power ON optimization algorithm in a case where each of a plurality of checkboxes shown in both screens of FIG. 7 are checked are described. In the test flows described in FIGS.

8 and 9, unlike in the test flow described in FIG. 6, the wait times between the plurality of processes in each output channel are designated by the user.

The upper portion of FIG. 8 shows a graph before the alteration shortening the test execution time using the power ON optimization algorithm is added, the center portion of FIG. 8 shows a graph after this alteration is added, in a state where the checkbox shown in area (1) in the screen of portion [A] of FIG. 7 and the checkbox shown in area (1) in the screen of portion [B] of FIG. 7 are all unchecked. Furthermore, the bottom portion of FIG. 8 shows a graph after this alteration is added, in a state where the checkbox shown in area (1) in the screen of portion [A] of FIG. 7 is checked and the checkbox shown in area (1) in the screen of portion [B] of FIG. 7 is unchecked. In each graph, the horizontal axis is the time axis, and the output channel 1, the output channel 2, and the output channel 3 are shown in order from the top.

In the state where the checkboxes in area (1) in each screen of portion [A] and portion [B] of FIG. 7 are unchecked, the generating section 41 according to the present embodiment applies the power ON optimization algorithm to the target test to separate the relay closing processes from the power ON processes and to start the relay closing processes of a subsequent output channel without waiting for the wait time described above to pass when the relay closing process of one output channel ends, for example. In this way, the generating section 41 shortens the execution time of the target test by eliminating the wait time described above, without performing the plurality of processes for closing the relays among each of the output channels in parallel.

Furthermore, in the state where the checkbox shown in area (1) in the screen of portion [A] in FIG. 7 is checked and the checkbox shown in area (1) in the screen of and portion [B] of FIG. 7 is unchecked, the generating section 41 according to the present embodiment applies the power ON optimization algorithm to the target test to separate the power ON processes from the relay closing processes and to perform the plurality of relay closing processes among the plurality of output channels in parallel, thereby performing the power ON process of a subsequent output channel immediately after the wait time has passed from the end of the power ON process of one output channel. In this way, the generating section 41 shortens the execution time of the target test by eliminating the time during which the relay closing process in one output channel is in standby without starting until the power ON process in another output channel ends, while maintaining the wait time between the power ON processes.

In the graph before the alteration in the top portion of FIG. 8, the relay closing process of the output channel 1 starts at the timing t1, this process ends at the timing t2, the power ON process of the output channel 1 is performed and the count for the wait time of the output channel 2 is started at the timing t3, the wait time ends and the relay closing process of the output channel 2 is started at the timing t4, and after this, similar processes are repeated for the output channel 2 and the output channel 3 from the timing t4 to the timing t9.

As shown by the graph before the alteration in the top portion of FIG. 8, in the target test before the power ON optimization algorithm is applied, the power ON process and the relay closing process in each of the plurality of output channels are integrated power ON events. If these power ON events are designated to be continuous among the plurality of output channels, the plurality of power ON events are performed sequentially, such that the power ON event is a subsequent output channel is started after waiting for the relay closing interval during the power ON event in the previous output channel and the further waiting for a wait time from when the power ON process is performed after the end of the relay closing interval.

On the other hand, in the graph after the alteration in the center portion of FIG. 8, the relay closing process of the output channel 1 is started at the timing t1, this process is finished and the relay closing process of the output channel 2 is started at the timing t2, the power ON process of the output channel 1 is performed at the timing t3, and after this, similar processes are repeated for the output channel 2 and the output channel 3 from the timing t3 to the timing t7.

Furthermore, in the graph after the alteration in the bottom portion of FIG. 8, the relay closing process of the output channel 1 is started at the timing t1, the relay closing process of the output channel 2 is started at the timing t2, and the relay closing process of the output channel 3 is started at the timing t3. Then, the relay closing process of the output channel 1 is finished at the timing t4, the power ON process of the output channel 1 is performed and the wait time count of the output channel 2 is started at the timing t5, the relay closing process of the output channel 2 is finished at the timing t6, and the relay closing process of the output channel 3 is finished at the timing t7. Then, the wait time of the output channel 2 ends, the power ON process of the output channel 2 is performed, and the wait time count of the output channel 3 is started at the timing t8, and this wait time is finished and the power ON process of the output channel 3 is performed at the timing t9.

A graph before the alteration shortening the test execution time using the power ON optimization algorithm is added is shown in the top portion of FIG. 9, and a graph after this alteration has been added, in a state where the checkbox shown in area (1) in the screen of portion [A] of FIG. 7 and the checkbox shown in area (1) in the screen of portion [B] of FIG. 7 are all checked and only the checkbox for the process "User Function" shown in area (2) in the screen of portion [B] of FIG. 7 is checked, is shown in the bottom portion of FIG. 9.

In each graph, the horizontal axis is the time axis, and the output channel 1 and output channel 2 are shown in order from the top. Furthermore, in each graph, a plurality of process elements that do not cause output to the DUT 10 are arranged on the time axis of each output channel. An example of such a process element is shown by the element fx described above.

In the state where the checkboxes shown in area (1) in each screen of portion [A] and portion [B] of FIG. 7 are all checked and only the checkbox for the process "User Function" shown in area (2) in the screen of portion [B] of FIG. 7 is checked, the generating section 41 according to the present embodiment applies the power ON optimization algorithm to the target test to separate the power ON processes from the relay closing processes and set processes included in the target test, e.g. processes that do not cause output to the DUT 10, to be performed in parallel with the relay closing processes, thereby shortening the test execution time, for example. As an example, the generating section 41 performs the relay closing processes among the plurality of output channels and the processes that do not cause output to the DUT 10, thereby starting the relay closing processes without waiting until the processes that do not cause output to the DUT 10 are performed and performing the power ON process of a subsequent output channel immediately after the wait time has passed from the end of the power ON process of one output channel. In this way, the generating section 41 shortens the execution time of the target test by eliminating the standby time until the processes that do not cause output to the DUT 10 are performed and the standby time without starting of the relay closing process in one output channel until the power ON process in another output channel is completed, while maintaining the wait time between the power ON processes.

In the graph before the alteration in the top portion of FIG. 9, a plurality of processes that do not cause output to the DUT 10 are performed in order before the timing t1, the relay closing process of the output channel 1 is started at the timing t1, this process ends at the timing t2, the power ON process of the output channel 1 is performed and the wait time count of the output channel 2 is started at the timing t3, and the wait time ends and the relay closing process of the output channel 2 is started at the timing t4.

On the other hand, in the graph after the alteration in the bottom portion of FIG. 9, the relay closing process of the output channel 1 is started at the timing t1 before the element fx process among the plurality of processes that do not cause output to the DUT 10 is performed in the output channel 1, and the relay closing process of the output channel 2 is started at the timing t2 before the element fx process among the plurality of processes that do not cause output to the DUT 10 is performed in the output channel 2. Then, the relay closing process of the output channel 1 ends at the timing t3, the power ON process of the output channel 1 is performed and the wait time count of the output channel 2 is started at the timing t4, the relay closing process of the output channel 2 ends at the timing t5, and the relay closing process of the output channel 3 ends and the power ON process of the output channel 2 is performed at the timing t6.

Figure 10:
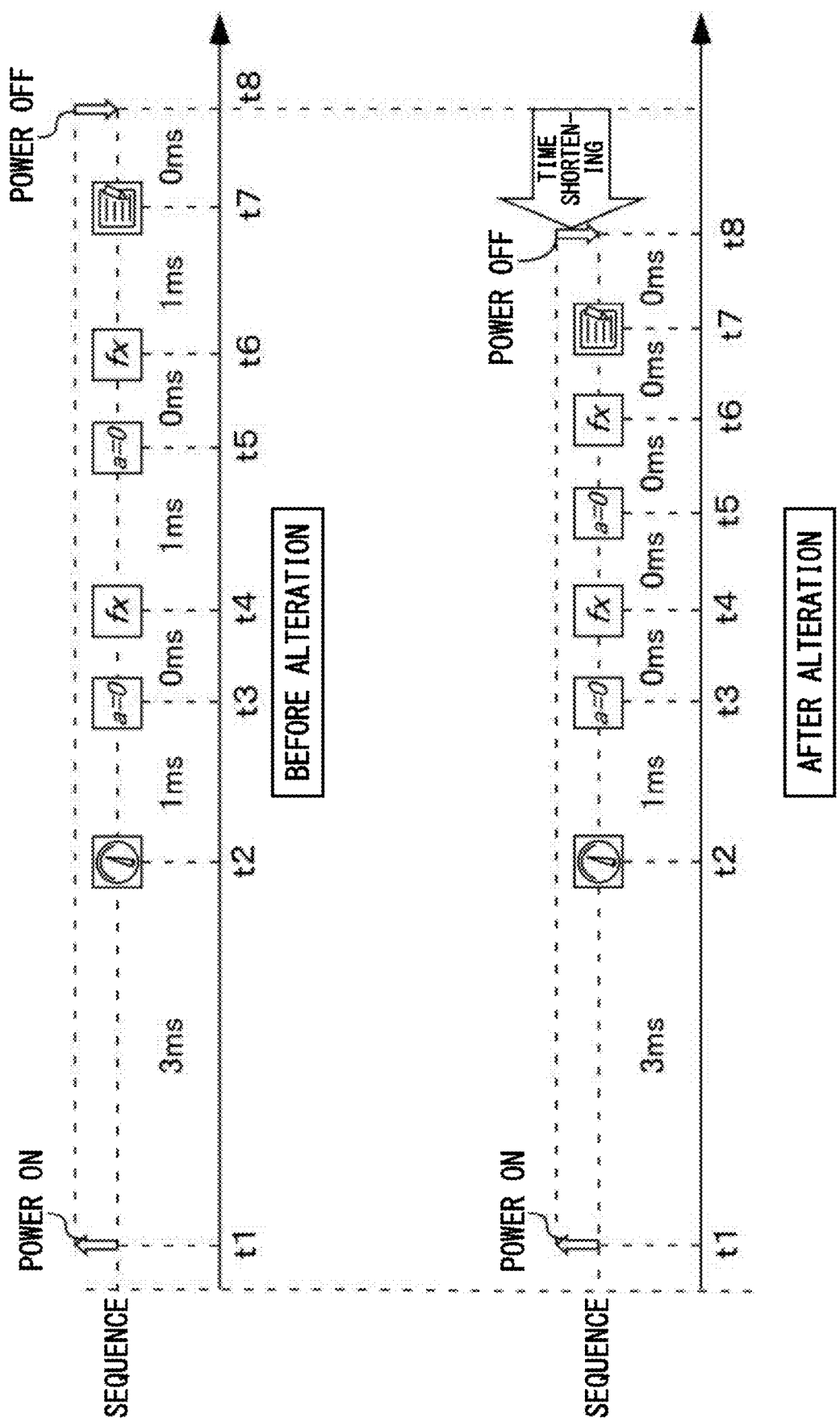
FIG. 10 is a graph describing an example of the unnecessary wait time elimination algorithm according to the present embodiment.

FIG. 10 is a graph describing an example of an unnecessary wait time elimination algorithm according to the present embodiment. A graph before an alteration shortening the test execution time using the unnecessary wait time elimination algorithm is added is shown in the top portion of FIG. 10, and a graph after this alteration is added is shown in the bottom portion of FIG. 10. In each graph, the horizontal axis is the time axis, and each graph shows one sequence.

In each graph, a plurality of process elements that cause output to the DUT 10 are arranged respectively at the timing t1 and the timing t2 at the left end and at the timing t8 at the right end, and a plurality of process elements that do not cause output to the DUT 10 are arranged at each timing from the timing t3 to the timing t7, in the timing chart of the sequence on the time axis.

The generating section 41 according to the present embodiment shortens the test execution time by applying, to the target test, the unnecessary wait time elimination algorithm that includes eliminating the wait time between a plurality of processes that do not cause output to the DUT 10 in the target test, for example. In the wait time between the plurality of processes that do not cause output to the DUT 10, there is a high possibility that a setup time and a hold time are unnecessary and that the test result will not be negatively affected if this wait time is eliminated, for example. Furthermore, the generating section 41 does not add the alteration using the unnecessary wait time elimination algorithm to processes designated by the user, among the plurality of processes that do not cause output to the DUT 10 in the target test, for example.

In the graph before the alteration in the top portion of FIG. 10 the time intervals between the respective processes are shown to be 3 ms between the timings t1 and t2, 1 ms between the timings t2 and t3, 0 ms between the timings t3 and t4, 1 ms between the timings t4 and t5, 0 ms between the timings t5 and t6, 1 ms between the timings t6 and t7, and 0 ms between the timings t7 and t8.

On the other hand, the graph after the alteration in the bottom portion of FIG. 6 differs from the graph before the alteration in that, among the time intervals between the respective processes, the time intervals between the timings t4 and t5 and between the timings t6 and t7 are each shown to be 0 ms.

Furthermore, in this case, the judging section 47 according to the present embodiment judges whether the altered test result acquired by performing the altered test candidate, generated by applying the unnecessary wait time elimination algorithm to the target test, on the DUT 10 is negatively affected. More specifically, if the altered test result from the DUT 10 indicates a pass or that the bin has not changed from the bin before the alteration even when this altered test candidate is performed repeatedly on the DUT 10, the judging section 47 judges that there was no negative effect on the altered test result, and judges that this time interval is unnecessary.

Figure 11:
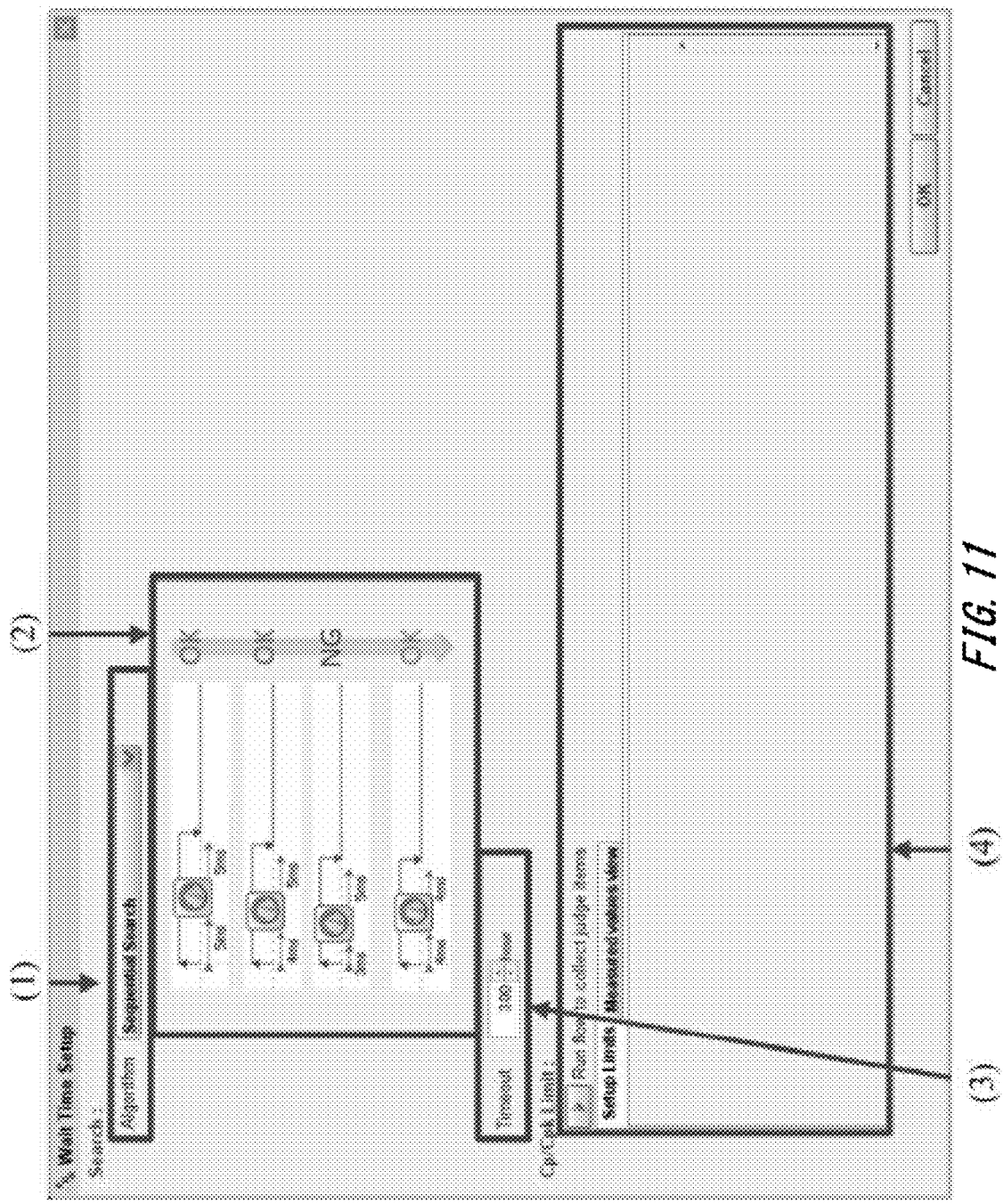
FIG. 11 is an example of a setting dialog screen concerning the wait time optimization algorithm, displayed in the display section 60 according to the present embodiment.

FIG. 11 is an example of a setting dialog screen concerning the wait time optimization algorithm, displayed in the display section 60 according to the present embodiment. This setting dialog screen is opened by clicking the setup button arranged in the wait time optimization column in the optimization setting table in area (5) in the main screen of FIG. 4. In order to describe the setting dialog screen of FIG. 11, the setting dialog screen is divided into a plurality of areas by frame lines, and each area is indicated by an arrow (1) to (4). This setting dialog screen is used in step S101 described above, for example, A search algorithm selection button is displayed in area (1), and when this selection button is clicked by the user, a pulldown menu is displayed and one search algorithm is selected by the user from among a plurality of search algorithms.

A search algorithm description area is displayed in area (2), and a general operational description, using a sequence example, of the search algorithm selected by the selection button of area (1) is displayed in this search algorithm description area.

A button for designating the time until timing out is displayed in area (3), and the time until the application of the search algorithm is ended is designated in this area by user input, in units of 0.25 hours from 0.25 hours (15 minutes) to 8760.00 hours (24 hours×365 days), for example.

An additional indicator setting area is displayed in area (4), and a judgment standard of the optimization needed to execute the flow according to the search algorithm is set by user input in this area. An indicator sampling button is arranged in the upper left portion of area (4), and a Setup Limits tab and measured values view tab are arranged below the indicator sampling button. When each tab is clicked by the user, the field in the bottom portion of the tab switches to a screen of a table corresponding to this tab. When the indicator sampling button is clicked by the user, additional indicator sampling is performed according to the designation of the repetition setting area shown in area (3) in the main screen of FIG. 4, and the execution result is displayed in each table described above. In the setup limits table, an indicator serving as a standard and a lower limit of the indicator value are designated by user input. The indicator serving as a standard is Cp or Cpk of the process capability index described above, and is designated as Cp or Cpk by the user. It should be noted that, in the initial settings, Cp is designated if an undefined value is included in the measured Cp, and disable is designated if an undefined value is not included in the measured Cp.

There are cases where the designation of the lower limit of Cp or Cpk by the user is difficult if there is no judgment standard. Therefore, measured values are displayed in the setup limits table as execution results of the additional indicator sampling, and the statistical values that are references for the user are displayed in the measured values view table. In this way, when the user designates the lower limit for Cp or Cpk of a measured voltage value, for example, the user can reference how large Cp or Cpk is on average. In this way, the display section 60 according to the present embodiment displays to the user the process capability index of the target statistical value acquired by repeatedly performing the target test on the DUT 10, and displays a screen for designating the standard to be satisfied by the process capability index of the target statistical value, e.g. the lower limit of Cp or Cpk.

The generating section 41 according to the present embodiment shortens the test execution time by applying the wait time optimization algorithm that includes shortening the wait time between a plurality of processes causing output to the DUT 10 in the target test. More specifically, the generating section 41 generates a plurality of altered test candidates to which alterations shortening the wait time between a plurality of processes causing output to the DUT 10 in the target test have been added. As an example, there are cases where the there is no negative effect on the test results even when the wait time between a plurality of processes that cause output to the DUT 10 is shortened by shortening the setup time and the hold time. Furthermore, the generating section 41 does not add the alteration of the wait time optimization algorithm to the processes designated by the user among the plurality of processes causing output to the DUT 10 in the target test, for example.

The judging section 47 according to the present embodiment judges whether there is a negative effect on the altered test result acquired by performing the altered test candidate, generated by applying the wait time optimization algorithm to the target test, to the DUT 10. More specifically, if the altered test result from the DUT 10 indicates a pass, that the bin has not changed from the bin before the alteration, and that the process capability index of Cp or Cpk satisfies the standard even when this altered test candidate is repeatedly performed on the DUT 10, the judging section 47 judges that there was no negative effect on the altered test result, and judges that the shortened time interval is sufficient.

Furthermore, the determining section 49 according to the present embodiment searches for a specific altered test candidate having the shortest execution time among the plurality of altered test candidates judged by the judging section 47 to be capable of replacing the target test, among the plurality of altered test candidates generated by the generating section 41, and determines this specific altered test candidate to be the altered test for replacing the target test. The determining section 49 may search for a specific altered test candidate having an execution time that is less than or equal to a predetermined objective time among the plurality of altered test candidates judged by the judging section 47 to be capable of replacing the target test, among the plurality of altered test candidates generated by the generating section 41, and determine this specific altered test candidate to be the altered test for replacing the target test. This objective time is designated by the user as described using FIG. 4, for example. The search algorithms used by the determining section 49 according to the present embodiment include a sequential search, binary search, screening search, and artificial intelligence search, for example.

If a sequential search is used, the determining section 49 according to the present embodiment repeatedly causes the generating section 41 to generate a new altered test candidate to which is added the alteration shortening the wait time between a plurality of processes that cause output to the DUT 10 by a certain time unit in the altered test candidate, on the condition that this altered test candidate has been judged to be capable of replacing the target test, for example. More specifically, focusing on one time interval, if an altered test candidate shortened by 1 ms is repeatedly performed and the judging section 47 judges that this altered test candidate does not negatively affect the altered test result, in the manner described above, the determining section repeatedly performs a new altered test candidate in which the time interval is shortened by 1 ms in the same manner, and repeats this entire process in the same manner, for example. Such a process is performed on all of the wait times between the plurality of processes that cause output to the DUT 10, and the altered test candidate having the shortest test execution time, from among the plurality of altered test candidates judged to be capable of replacing the target test, is determined to be the altered test to replace the target test. As an example, in the sequential search, the altered test candidate shortened by 1 ms is repeatedly performed 100 times. For example, in a case where a time interval of 100 ms is to be shortened to 90 ms, a plurality of altered test candidates that are each shortened by 1 ms are repeatedly performed 1000 times (=10×100 times). A general operational description using the sequential search is displayed in area (2) in the setting dialog screen of FIG. 11.

When performing a binary search, the determining section 49 according to the present embodiment causes the generating section 41 to repeat the generation of a new altered test candidate to which is added the alteration shortening the wait time between a plurality of processes that cause output to the DUT 10 of the altered test candidate, using the bisection method, on the condition that it is judged that this altered test candidate can replace the target test, for example. More specifically, focusing on one time interval, if an altered test candidate in which the time is altered using the bisection method, i.e. the time interval is halved, is repeatedly performed and the judging section 47 judges that this altered test candidate does not negatively affect the altered test result, in the manner described above, the determining section 49 repeatedly performs a new altered test candidate in which the same time interval is halved in the same manner, and repeats this entire process in the same manner, for example. Such a process is performed on all of the wait times between the plurality of processes that cause output to the DUT 10, and the altered test candidate having the shortest test execution time, from among the plurality of altered test candidates judged to be capable of replacing the target test, is determined to be the altered test to replace the target test. As an example, in the binary search, the altered test candidate shortened using the bisection method is repeatedly performed 100 times.

When performing a screening search, the determining section 49 according to the present embodiment causes the generating section 41 to generate a new altered test candidate to which is added an alteration further shortening the wait time of the altered test candidate by a unit of time, on the condition that this altered test candidate is judged to be capable of replacing the target test based on a comparison result of a comparison between the target test result and the altered test result obtained by performing this altered test candidate, which was generated by adding an alteration shortening the wait time between the plurality of processes that cause output to the DUT 10, a first number of times, for example. Then, in response to the judgment that the altered test candidate is not capable of replacing the target test, the comparison between the target test result and the altered test result obtained by repeating the test sequences included in the altered test candidate immediately before this alteration is repeated a predetermined number of times until it is judged that the altered test candidate can replace the target test. The first number of times mentioned above may be less than the predetermined number of times mentioned above, and as an example, the first number of times may be once and the predetermined number of times may be 100 times.

When performing an artificial intelligence search, the determining section 49 according to the present embodiment uses a genetic algorithm using, as a gene, a set of wait times between a plurality of processes that cause output to the DUT 10, in each of a plurality of test sequences included in the target test. This set of wait times between the plurality of processes serving as the gene may be a set of wait times between adjacent processes or may be a set of wait times between non-adjacent processes. By performing this genetic algorithm, the determining section 49 determines an altered test candidate including a plurality of test sequences for which the wait times between a plurality of processes have been altered, causes the generating section 41 to generate this altered test candidate, determines a new altered test candidate that included a plurality of test sequences for which the wait times between the plurality of processes in the altered test candidate have been further altered according to the genetic algorithm described above, and causes the generating section 41 to again generate this altered test candidate. The determining section 49 then determines the specific altered test candidate having the shortest test execution time, among the plurality of altered test candidates judged by the judging section 47 to be capable of replacing the target test, to be the altered test for replacing the target test. When determining and generating a new altered test candidate in the same manner as described above, the determining section 49 may determine and generate the new altered test candidate described above from an altered test candidate that has been judged or could possibly be judged by the judging section 47 to not be capable of replacing the target test, using the judgment by the judging section 47 that the target test can be replaced by the altered test candidate as a condition, or without setting such a condition, e.g. by using a roulette wheel selection. Furthermore, the determining section 49 may search for a specific altered test candidate having an execution time that is less than or equal to the predetermined objective time, from among the plurality of altered test candidates judged by the judging section 47 to be capable of replacing the target test, and determine this specific altered test candidate to be the altered test for replacing the target test. This objective time is designated by the user as described using FIG. 4, for example.

Figure 12:
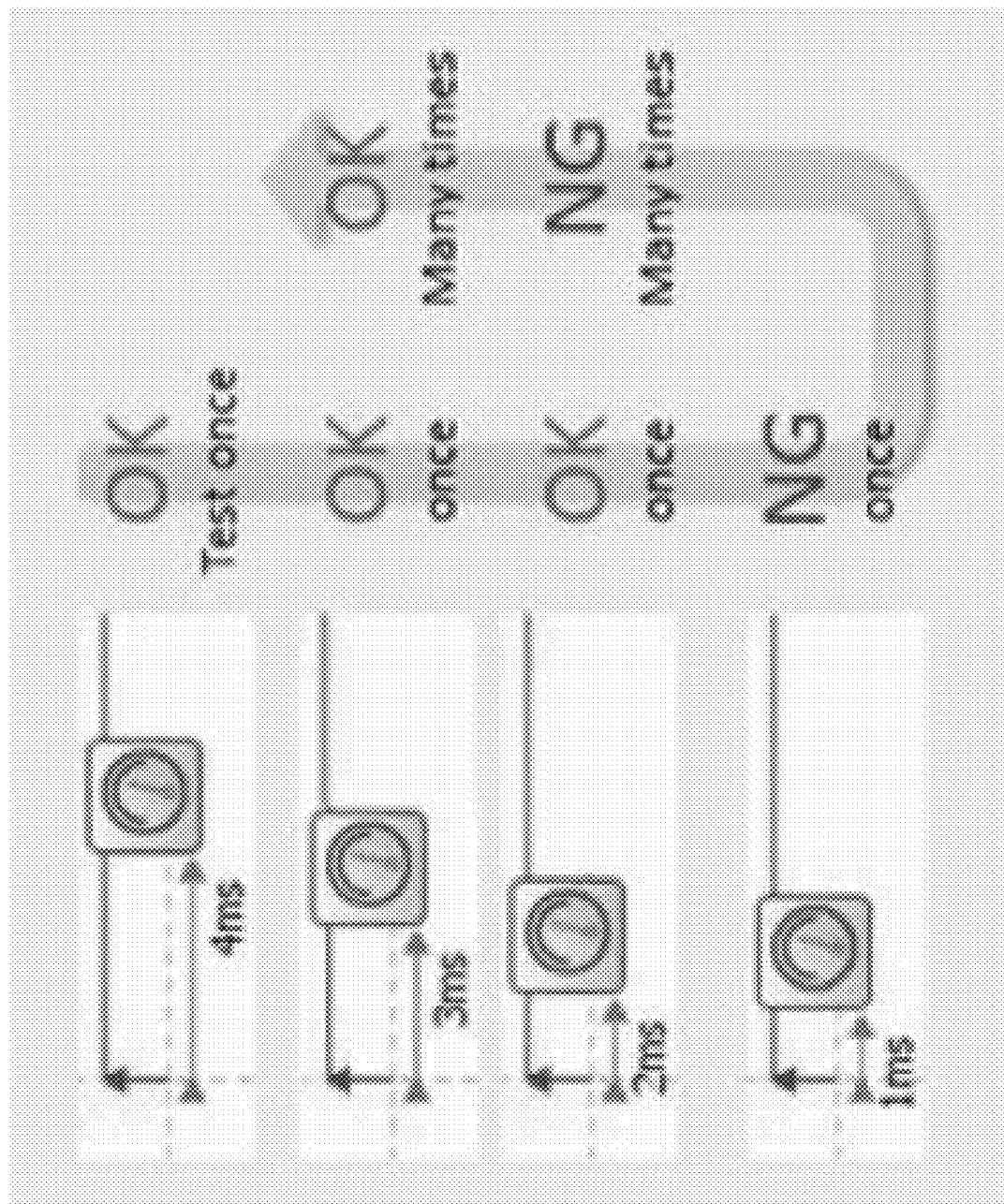
FIG. 12 is a diagram describing the screening search in an example of a wait time optimization algorithm according to the present embodiment.

FIG. 12 is a diagram describing the screening search in an example of a wait time optimization algorithm according to the present embodiment. In FIG. 12, a power ON process element and a measurement process element are shown in a timing chart of one test sequence, and judgment results are shown along with an operation gradually reducing the execution time interval between these elements 1 ms at a time in order from the top.

Focusing on one time interval, if an altered test candidate shortened by 1 ms is performed once and the judging section 47 judges that this altered test candidate does not negatively affect the altered test result, in the manner described above, the determining section 49 performs, one time, a new altered test candidate in which the time interval is shortened by 1 ms in the same manner, and repeats this process in the same manner. When it is judged by the judging section 47 that the altered test candidate shortened by 1 ms at a time has a negative effect on the altered test result, the altered test candidate that is one candidate prior to the altered test candidate causing the negative effect, i.e. the altered test candidate whose time interval is 1 ms longer than that of the altered test candidate causing the negative effect, is returned to, and this altered test candidate is repeatedly performed 100 times at first. As a result, if it is judged by the judging section 47 that this altered test candidate has a negative effect on the altered test result, the altered test candidate that is one earlier is returned to and the same process is repeated, and when an altered test candidate is discovered that is judged by the judging section 47 to not have a negative effect on the altered test results, as the result of 100 repetitions of this altered test candidate, this altered test candidate is judged to be capable of replacing the target test.

The process described above is performed for all of the wait times between the plurality of processes that cause output to the DUT 10, and the altered test candidate having the shortest test execution time, among the plurality of altered test candidates judged to be capable of replacing the target test, is determined to be the altered test for replacing the target test. For example, if it is judged that there is a negative effect on the altered test result when a certain time interval is shortened to 90 ms, 1 ms at a time, from 100 ms, the altered test candidate is performed 10×1 times. Then, if it is judged that there is no negative effect on the altered test result when the time interval has been increased by 1 ms to 91 ms, this altered test candidate is performed 1×100 times. The total number of times the plurality of altered test candidates are performed in this case is 110 times.

Figure 13:
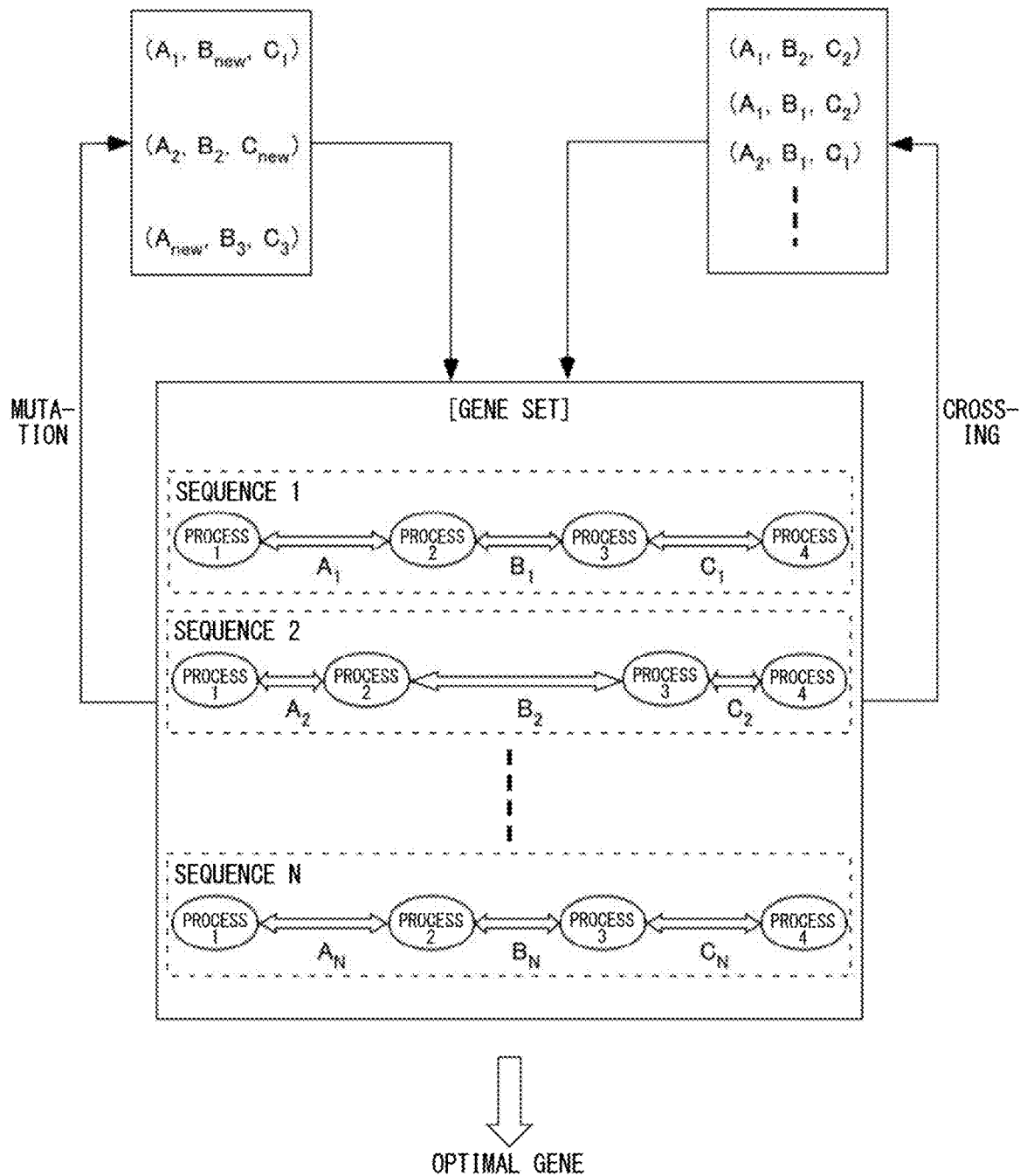
FIG. 13 is a diagram describing a genetic algorithm that is an example of the wait time optimization algorithm of the present embodiment.

FIG. 13 is a diagram describing a genetic algorithm that is an example of the wait time optimization algorithm of the present embodiment. The genetic algorithm described here is an example of a genetic algorithm used when the determining section 49 according to the present embodiment performs the artificial intelligence search, as described above.

With the genetic algorithm according to the present embodiment, a set of wait times between a plurality of processes that cause output to the DUT 10 is used as a gene, and N individual test sequences represented by the genes are prepared as individuals, for example. In the center of FIG. 13, a gene set containing N test sequences is shown as the current generation. The number of individuals N may differ according to the generation. The plurality of test sequences in the current generation, which is the first generation, are generated randomly from target test sequences included in the target test, and the determining section 49 determines the plurality of sequences of the current generation to be a plurality of test sequences included in the altered test candidate and causes the generating section 41 to generate this altered test candidate.

The determining section 49 according to the present embodiment acquires the judgment result judged by the judging section 47 for the altered test result obtained by performing the plurality of test sequences of the current generation on the DUT 10. As an example, this judgment result is obtained by calculating an evaluation value of each individual in the current generation, using an evaluation function. The determining section 49 then performs one of a crossover or mutation, with a certain probability, and saves the result in the next generation. More specifically, as an example shown in FIG. 13, sequence 1 ($A_1$, $B_1$, $C_1$) and sequence 2 ($A_2$, $B_2$, $C_2$) extracted from the current generation gene set are crossed to generate a sequence ($A_1$, $B_2$, $C_2$), and this sequence is saved in the next generation. Furthermore, as an example, sequence 1 (A, B, C) extracted from the current generation gene set is mutated to generate a sequence ($A_1$, $B_{new}$, $C_1$), and this sequence is saved in the next generation. At this time, portions of the test sequences that have a low evaluation value are eliminated with a certain probability. The determining section 49 repeats this process for each generation, until reaching the maximum number of generations, until improvement in the evaluation values is no longer seen, until a predetermined time has passed, or until forcibly ended by the user. The determining section 49 ultimately outputs the individual test sequence with the highest evaluation value in the current generation as the optimal gene. The determining section 49 may copy the current generation test sequence as-is with a certain probability and store this test sequence in the next generation.

Figure 14:
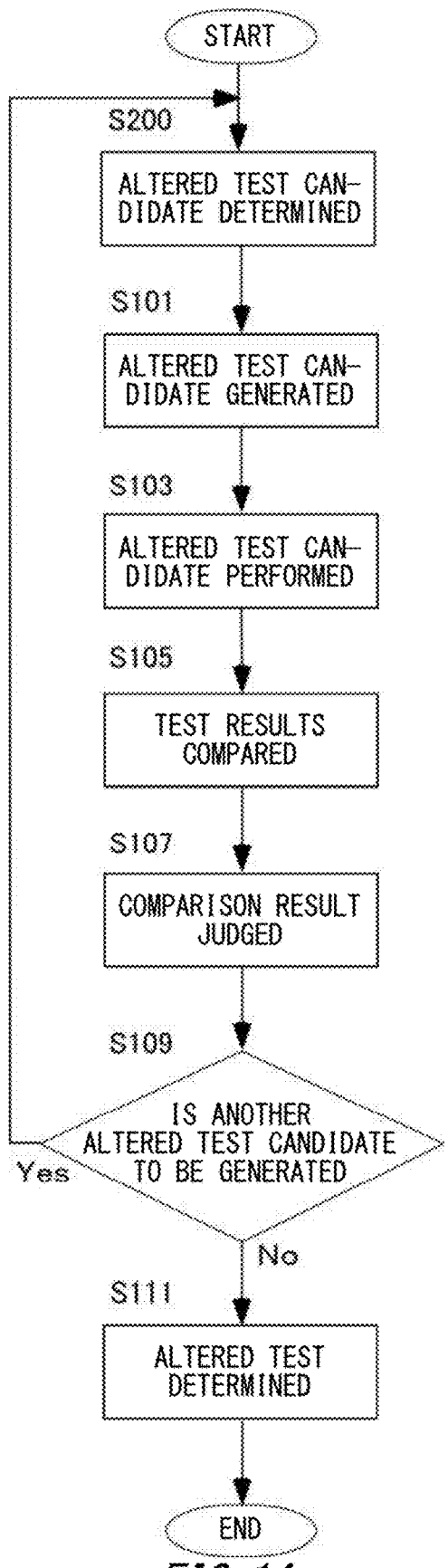
FIG. 14 shows an operational flow of the computer 30 according to the present embodiment.

FIG. 14 shows an operational flow of the computer 30 according to the present embodiment. In the operational flow of FIG. 14, the determining section 49 uses the artificial intelligence search to search for the altered test candidate having the shortest test execution time, among the plurality of altered test candidates judges to be capable of replacing the target test among the plurality of altered test candidates, and determines this altered test candidate to be the altered test for replacing the target test. This flow is started by activating the testing tool installed in the computer 30, in the same manner as the operational flow of FIG. 3, for example.

The computer 30 determines, as the altered test candidate, the N test sequences generated randomly from the test sequence included in the target test, using the genetic algorithm, and determines the altered test candidate to be a test sequence obtained by crossing two test sequences or mutating one test sequence, for example (step S200). After this, steps S101 to S111 are the same as steps S101 to S111 in the operational flow of FIG. 3. However, at step S109, the computer 30 keeps returning to step S200 until the crossing or mutation is performed with a certain probability on all of the test sequences in the current generation (step S109: Yes). Furthermore, at step S109, if the processes from step S200 to step S109 are repeated until reaching the maximum number of generations or until no improvement is seen in the evaluation values for each generation (step S109: No), the computer 30 determines the test sequence with the highest evaluation value to be an example of the altered test (step S111).

Various embodiments of the present invention may be described with reference to flowcharts and block diagrams whose blocks may represent (1) steps of processes in which operations are performed or (2) sections of apparatuses responsible for performing operations. Certain steps and sections may be implemented by dedicated circuitry, programmable circuitry supplied with computer-readable instructions stored on computer-readable media, and/or processors supplied with computer-readable instructions stored on computer-readable media. Dedicated circuitry may include digital and/or analog hardware circuits and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), and the like.

The computer-readable medium may be a tangible device that can store instructions to be executed by a suitable device, and as a result, a computer-readable medium having instructions stored thereon is a product that includes instructions that can be executed in order to create the means for executing the operations designated by flow charts and block diagrams. Examples of the computer-readable medium may include an electronic storage device, a magnetic storage device, an optical storage device, an electromagnetic recording medium, a magnetic recording medium, an optical recording medium, an electromagnetic recording medium, a semiconductor recording medium, and the like. Specific examples of the computer-readable medium may include a floppy (Registered Trademark) disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a portable compact disc read-only memory (CD-ROM), a digital versatile disk (DVD), a Blu-ray (Registered Trademark) disk, a memory stick, an integrated circuit card, or the like.

The computer-readable instructions may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, JAVA (Registered Trademark), Javascript (Registered Trademark), C-++ or the like, and conventional procedural programming languages, such as the "C" programming language or similar programming languages.

The computer-readable instructions may be provided to a processor or programmable circuitry of a general purpose computer, special purpose computer, or other programmable data processing apparatus to produce a machine, either locally, via a local area network (LAN), or via a wide area network (WAN) such as the Internet, and may be executed to create the means for performing the operations designated by the flow charts and block diagrams. Examples of the processor include a computer processor, a processing unit, a microprocessor, a digital signal processor, a controller, a microcontroller, and the like.

Figure 15:
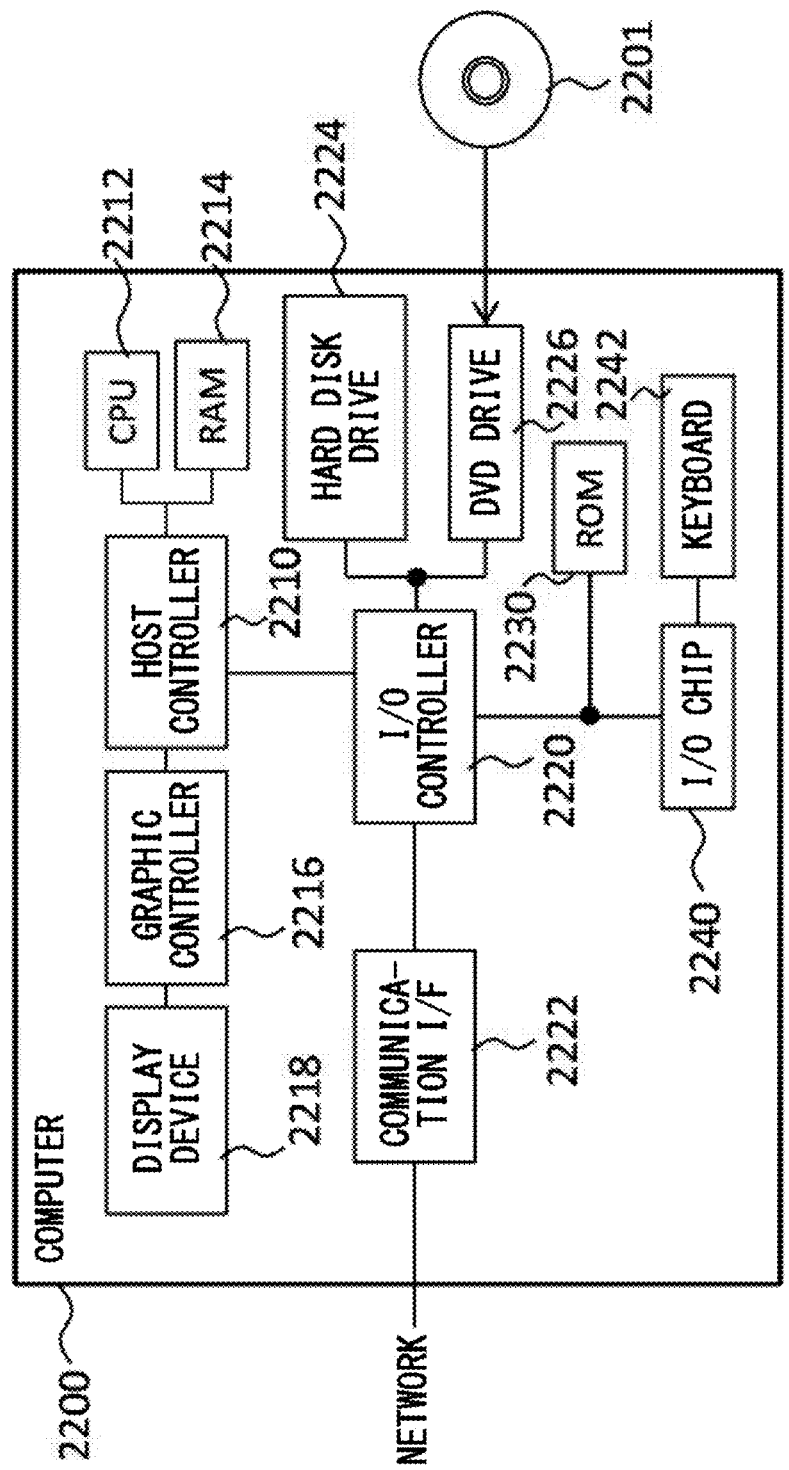
FIG. 15 shows an exemplary configuration of a computer 2200 according to the present embodiment.

FIG. 15 shows an example of a computer 2200 in which aspects of the present invention may be wholly or partly embodied. A program that is installed in the computer 2200 can cause the computer 2200 to function as or perform operations associated with apparatuses of the embodiments of the present invention or one or more sections thereof, and/or cause the computer 2200 to perform processes of the embodiments of the present invention or steps thereof. Such a program may be executed by the CPU 2212 to cause the computer 2200 to perform certain operations associated with some or all of the blocks of flowcharts and block diagrams described herein.

The computer 2200 according to the present embodiment includes a CPU 2212, a RAM 2214, a graphic controller 2216, and a display device 2218, which are mutually connected by a host controller 2210. The computer 2200 also includes input/output units such as a communication interface 2222, a hard disk drive 2224, a DVD-ROM drive 2226 and an IC card drive, which are connected to the host controller 2210 via an input/output controller 2220. The computer also includes legacy input/output units such as a ROM 2230 and a keyboard 2242, which are connected to the input/output controller 2220 through an input/output chip 2240.

The CPU 2212 operates according to programs stored in the ROM 2230 and the RAM 2214, thereby controlling each unit. The graphic controller 2216 obtains image data generated by the CPU 2212 on a frame buffer or the like provided in the RAM 2214 or in itself, and causes the image data to be displayed on the display device 2218.

The communication interface 2222 communicates with other electronic devices via a network. The hard disk drive 2224 stores programs and data used by the CPU 2212 within the computer 2200. The DVD-ROM drive 2226 reads the programs or the data from the DVD-ROM 2201, and provides the hard disk drive 2224 with the programs or the data via the RAM 2214. The IC card drive reads programs and data from an IC card, and/or writes programs and data into the IC card.

The ROM 2230 stores therein a boot program or the like executed by the computer 2200 at the time of activation, and/or a program depending on the hardware of the computer 2200. The input/output chip 2240 may also connect various input/output units via a parallel port, a serial port, a keyboard port, a mouse port, and the like to the input/output controller 2220.

A program is provided by computer readable media such as the DVD-ROM 2201 or the IC card. The program is read from the computer readable media, installed into the hard disk drive 2224, RAM 2214, or ROM 2230, which are also examples of computer readable media, and executed by the CPU 2212. The information processing described in these programs is read into the computer 2200, resulting in cooperation between a program and the above-mentioned various types of hardware resources. An apparatus or method may be constituted by realizing the operation or processing of information in accordance with the usage of the computer 2200.

For example, when communication is performed between the computer 2200 and an external device, the CPU 2212 may execute a communication program loaded onto the RAM 2214 to instruct communication processing to the communication interface 2222, based on the processing described in the communication program. The communication interface 2222, under control of the CPU 2212, reads transmission data stored on a transmission buffering region provided in a recording medium such as the RAM 2214, the hard disk drive 2224, the DVD-ROM 2201, or the IC card, and transmits the read transmission data to a network or writes reception data received from a network to a reception buffering region or the like provided on the recording medium.

In addition, the CPU 2212 may cause all or a necessary portion of a file or a database to be read into the RAM 2214, the file or the database having been stored in an external recording medium such as the hard disk drive 2224, the DVD-ROM drive 2226 (DVD-ROM 2201), the IC card, etc., and perform various types of processing on the data on the RAM 2214. The CPU 2212 may then write back the processed data to the external recording medium.

Various types of information, such as various types of programs, data, tables, and databases, may be stored in the recording medium to undergo information processing. The CPU 2212 may perform various types of processing on the data read from the RAM 2214, which includes various types of operations, processing of information, condition judging, conditional branch, unconditional branch, search/replace of information, etc., as described throughout this disclosure and designated by an instruction sequence of programs, and writes the result back to the RAM 2214. In addition, the CPU 2212 may search for information in a file, a database, etc., in the recording medium. For example, when a plurality of entries, each having an attribute value of a first attribute associated with an attribute value of a second attribute, are stored in the recording medium, the CPU 2212 may search for an entry matching the condition whose attribute value of the first attribute is designated, from among the plurality of entries, and read the attribute value of the second attribute stored in the entry, thereby obtaining the attribute value of the second attribute associated with the first attribute satisfying the predetermined condition.

The above-explained program or software modules may be stored in the computer readable media on or near the computer 2200. In addition, a recording medium such as a hard disk or a RAM provided in a server system connected to a dedicated communication network or the Internet can be used as the computer readable media, thereby providing the program to the computer 2200 via the network.

While the embodiments of the present invention have been described, the technical scope of the invention is not limited to the above described embodiments. It will be apparent to persons skilled in the art that various alterations and improvements can be added to the above-described embodiments. It should also apparent from the scope of the claims that the embodiments added with such alterations or improvements are within the technical scope of the invention.

For example, the generating section 41 described above is capable of shortening the execution time by reducing the number of times a repeating process included in the target test is repeated, in order to generate the altered test candidate obtained by adding an alteration shortening the test execution time to the target test for testing the DUT 10. The repeating process included in the target test refers to one or more processes that are loop processes included in the target test, for example.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

1: test system, 10: DUT, 20: test apparatus, 30: computer, 40: control section, 41: generating section, 43: test processing section, 44: communicating section, 45: comparing section, 47: judging section, 49: determining section, 50: storage section, 60: display section, 2200: computer, 2201: DVD-ROM, 2210: host controller, 2212: CPU, 2214: RAM, 2216: graphic controller, 2218: display device, 2220: input/output controller, 2222: communication interface, 2224: hard disk drive, 2226: DVD-ROM drive, 2230: ROM, 2240: input/output chip, 2242: keyboard

What is claimed is:

1. A system comprising:
a processor configured to:
generate an altered test candidate obtained by adding an alteration shortening an execution time of a test to a target test for testing a device under test;
control a test apparatus to perform the altered test candidate on the device under test;
compare an altered test result of the device under test resulting from the altered test candidate to a target test result of the device under test resulting from the target test;
judge whether the target test can be replaced by the altered test candidate, based on the comparison result;
if a difference between the altered test result and the target test result satisfies a passing standard, judge that the target test can be replaced by the altered test candidate;
generate a new altered test candidate, obtained by adding an alteration that further shortens an execution time of the altered test candidate to the altered test candidate, in response to the difference being judged to satisfy the passing standard; and
determine an altered test candidate having the shortest execution time, from among a plurality of the altered test candidates judged to be capable of replacing the target test, from among a plurality of the altered test candidates, to be an altered test for replacing the target test.

2. The system according to claim 1, wherein the processor is further configured to
generate a new altered test candidate, obtained by adding an alteration that further shortens an execution time of the altered test candidate to the altered test candidate, in response to a first bin that indicates a classification of the altered test result being judged to be the same as a second bin that indicates a classification of the target test result.

3. The system according to claim 1, wherein the processor is further configured to
on a condition that the execution time of an altered test candidate judged to be capable of replacing the target test among a plurality of the altered test candidates is less than or equal to a predetermined objective time, determine the altered test candidate that satisfies the condition to be an altered test for replacing the target test.

4. The system according to claim 1, wherein the processor is further configured to
shorten the execution time by shortening a wait time between a plurality of processes that cause output to the device under test in the target test.

5. The system according to claim 4, wherein the processor is further configured to
generate a plurality of altered test candidates to which are added alterations shortening the wait time between the plurality of processes causing output to the device under test,
search for a specific altered test candidate that has the shortest execution time, from among the plurality of altered test candidates judged to be capable of replacing the target test, from among the plurality of altered test candidates, and
determine the specific altered test candidate to be an altered test for replacing the target test.

6. The system according to claim 4, wherein the processor is further configured to
generate a plurality of altered test candidates to which are added alterations shortening the wait time between the plurality of processes causing output to the device under test,
search for a specific altered test candidate whose execution time is less than or equal to a predetermined objective time, from among the plurality of altered test candidates judged to be capable of replacing the target test, from among the plurality of altered test candidates, and
determine the specific altered test candidate to be an altered test for replacing the target test.

7. The system according to claim 1, wherein the processor is further configured to
generate a plurality of altered test candidates to which are added alterations shortening a wait time between a plurality of processes causing output to the device under test in the target test,
search for a specific altered test candidate that has the shortest execution time, from among the plurality of altered test candidates judged to be capable of replacing the target test, from among the plurality of altered test candidates, and
determine the specific altered test candidate to be the altered test for replacing the target test.

8. The system according to claim 3, wherein the processor is further configured to
generate a plurality of altered test candidates to which are added alterations shortening a wait time between a plurality of processes causing output to the device under test in the target test,
search for a specific altered test candidate whose execution time is less than or equal to a predetermined objective time, from among the plurality of altered test candidates judged to be capable of replacing the target test, from among the plurality of altered test candidates, and
determine the specific altered test candidate to be the altered test for replacing the target test.

9. The system according to claim 5, wherein the processor is further configured to
search for the specific altered test candidate by implementing a sequential search that, on a condition that it is judged that the target test can be replaced by the altered test candidate, repeatedly generate a new altered test candidate to which is added an alteration shortening the wait time of the altered test candidate by a unit of time.

10. The system according to claim 5, wherein the processor is further configured to
search for the specific altered test candidate by implementing a binary search that, on a condition that it is judged that the target test can be replaced by the altered test candidate, repeatedly generate a new altered test candidate to which is added an alteration shortening the wait time of the altered test candidate, using a bisection method.

11. The system according to claim 5, wherein the processor is further configured to
search for the specific altered test candidate by implementing a screening search that includes, on a condition that it is judged that the target test can be replaced by the altered test candidate based on a comparison result obtained by comparing the target test result to the altered test result obtained by performing, a first number of times, the altered test candidate to which has been added an alteration shortening the wait time by a unit of time, repeatedly generate a new altered test candidate to which has been added an alteration further shortening the wait time of the altered test candidate by a unit of time and, in response to a judgment being made that the target test cannot be replaced by the altered test candidate, repeating a comparison between the target test result and the altered test result obtained by repeating the altered test candidate immediately before the alteration a predetermined number of times until it is judged that the target test can be replaced by the altered test candidate, and the first number of times is less than the predetermined number of times.

12. The system according to claim 1, wherein the processor is further configured to determine the altered test candidate including a plurality of test sequences, included in the target test, in each of which wait times between a plurality of processes that cause output to the device under test have been altered, using a genetic algorithm in which a set of the wait times between the plurality of processes is a gene, generate the determined altered test candidate, determine a new altered test candidate that includes the plurality of test sequences in which the wait times between the plurality of processes of the altered test candidate have been further altered using the genetic algorithm, generate the new altered test candidate, and determine a specific altered test candidate having the shortest execution time among a plurality of altered test candidates judged to be capable of replacing the target test to be an altered test for replacing the target test.

13. The system according to claim 1, further comprising:

determine the altered test candidate including a plurality of test sequences, included in the target test, in each of which wait times between a plurality of processes that cause output to the device under test have been altered, using a genetic algorithm in which a set of the wait times between the plurality of processes is a gene, generate the determined altered test candidate, determine a new altered test candidate that includes the plurality of test sequences in which the wait times between the plurality of processes of the altered test candidate have been further altered using the genetic algorithm, generate the new altered test candidate, searches for a specific altered test candidate whose execution time is less than or equal to a predetermined objective time, among a plurality of altered test candidates judged to be capable of replacing the target test, and determine the specific altered test candidate to be an altered test for replacing the target test.

14. The system according to claim 1, wherein the execution time is shortened by deactivating an automatic power OFF process, set in advance in each of a plurality of test sequences included in the target test of the device under test, that automatically turns OFF a power source of the device under test every time one test sequence ends.

15. The system according to claim 1, wherein the execution time is shortened by setting a plurality of processes for closing relays that supply power to the device under test to be performed in parallel in the target test.

16. The system according to claim 1, wherein the execution time is shortened by setting a process for turning ON a power source of the device under test and a process for turning OFF the power source of the device under test to be performed repeatedly, in a state where relays for supplying power to the device under test are closed, in the target test.

17. The system according to claim 15, wherein the execution time is shortened by setting a process in the target test to be performed in parallel with the process for closing the relays.

18. The system according to claim 1, wherein the execution time is shortened by eliminating a wait time between a plurality of processes that do not cause output to the device under test in the target test.

19. The system according to claim 1, wherein the execution time is shortened by reducing the number of times that a repeating process included in the target test is repeated.

20. The system according to claim 1, wherein the processor is further configured to compare an altered statistical value of measured values acquired by repeatedly performing the altered test candidate on the device under test and a target statistical value of measured values acquired by repeatedly performing the target test on the device under test.

21. The system according to claim 20, wherein a process capability index, which is an indicator of a distribution of a plurality of measured values in a statistical value, is used to judge that the target test can be replaced by the altered test candidate if a standard satisfied by the process capability index of the target statistical value is satisfied by the process capability index of the altered statistical value.

22. The system according to claim 21, wherein the processor is further configured to display to a user a screen for showing the process capability index of the target statistical value and enabling designation of the standard.

23. The system according to claim 1, wherein the alteration is not added to a process designated by a user among a plurality of processes in the target test.

24. A method comprising:

generating an altered test candidate obtained by adding an alteration shortening an execution time of a test to a target test for testing a device under test;

causing a test apparatus to perform the altered test candidate on the device under test;

comparing an altered test result of the device under test resulting from the altered test candidate to a target test result of the device under test resulting from the target test;

judging whether the target test can be replaced by the altered test candidate, based on the comparison result of the comparison;

if a difference between the altered test result and the target test result satisfies a passing standard, judging that the target test can be replaced by the altered test candidate;

generating a new altered test candidate, obtained by adding an alteration that further shortens an execution time of the altered test candidate to the altered test candidate, in response to the difference being judged to satisfy the passing standard; and determining an altered test candidate having the shortest execution time, from among a plurality of the altered test candidates judged to be capable of replacing the target test, from among a plurality of the altered test candidates, to be an altered test for replacing the target test.

25. A non-transitory computer-readable storage medium storing thereon a program that causes a processor to perform a method comprising:
- generating an altered test candidate obtained by adding an alteration shortening an execution time of a test to a target test for testing a device under test;
- causing a test apparatus to perform the altered test candidate on the device under test;
- comparing an altered test result of the device under test resulting from the altered test candidate to a target test result of the device under test resulting from the target test;
- judging whether the target test can be replaced by the altered test candidate, based on the comparison result of the comparison;
- if a difference between the altered test result and the target test result satisfies a passing standard, judging that the target test can be replaced by the altered test candidate;
- generating a new altered test candidate, obtained by adding an alteration that further shortens an execution time of the altered test candidate to the altered test candidate, in response to the difference being judged to satisfy the passing standard; and
- determining an altered test candidate having the shortest execution time, from among a plurality of the altered test candidates judged to be capable of replacing the target test, from among a plurality of the altered test candidates, to be an altered test for replacing the target test.

\* \* \* \* \*